US010256921B2

(12) United States Patent
Bergsma et al.

(10) Patent No.: US 10,256,921 B2
(45) Date of Patent: Apr. 9, 2019

(54) REDUCING IMPEDANCE DISCONTINUITIES ON A SHARED MEDIUM

(71) Applicant: SKYWORKS SOLUTIONS, INC., Woburn, MA (US)

(72) Inventors: Adrian John Bergsma, Ottawa (CA); Peihua Ye, Irvine, CA (US); Thomas Obkircher, Santa Ana, CA (US); Peter Harris Robert Popplewell, Ottawa (CA); Gregory Edward Babcock, Ottawa (CA); William J. Domino, Yorba Linda, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/808,358

(22) Filed: Nov. 9, 2017

(65) Prior Publication Data

US 2018/0138990 A1 May 17, 2018

Related U.S. Application Data

(60) Provisional application No. 62/421,084, filed on Nov. 11, 2016.

(51) Int. Cl.
*H04B 15/00* (2006.01)
*H03G 3/30* (2006.01)
(Continued)

(52) U.S. Cl.
CPC .............. *H04B 15/00* (2013.01); *H03F 1/56* (2013.01); *H03F 3/19* (2013.01); *H03F 3/72* (2013.01);
(Continued)

(58) Field of Classification Search
CPC ........ H04B 15/00; H04B 1/40; H03G 3/3042; H03G 2201/106; H03G 3/348; H03F 1/56;
(Continued)

(56) References Cited

U.S. PATENT DOCUMENTS 6,144,535 A * 11/2000 Ishii ...................... H04B 1/0458
330/207 P
6,201,441 B1 3/2001 Suematsu et al.
(Continued)

OTHER PUBLICATIONS 3.3 V, Upstream Cable Line Driver, AD8324, Analog Devices, Inc., 2016, <http://www.analog.com/media/en/technical-documentation/data-sheets/AD8324.pdf> [retrieved from the Internet on Dec. 15, 2017].

(Continued)

*Primary Examiner* — Jaison Joseph
(74) *Attorney, Agent, or Firm* — Lando & Anastasi, LLP

(57) ABSTRACT

Systems and methods are provided for reducing the effects of an impedance mismatch between a communications system and a shared communications medium. A communication system, such as a transceiver within a cable modem, switches between various operating modes including a transmit mode, a receive mode, and a standby mode. The standby mode may be used while the transceiver is in an idle state between modes, such as while changing an amplifier gain states in between transmissions. While transitioning between modes, the impedance presented by the communications system can temporarily fluctuate causing unwanted signal reflections to propagate out of the communications system and on to the shared medium. Circuitry within the communications system, such as transmission circuitry including an adjustable attenuator, may be placed into a hybrid attenuation-isolation mode during the transition caus- (Continued)

ing the magnitude of any unwanted signal reflections to be attenuated and reducing the impact on the shared medium.

23 Claims, 13 Drawing Sheets

(51) Int. Cl.
*H03F 1/56* (2006.01)
*H03F 3/19* (2006.01)
*H04B 1/40* (2015.01)
*H03F 3/72* (2006.01)
*H03G 3/34* (2006.01)
*H04B 1/44* (2006.01)
*H04B 1/04* (2006.01)
*H04B 1/18* (2006.01)

(52) U.S. Cl.
CPC ........... *H03G 3/3042* (2013.01); *H03G 3/348* (2013.01); *H04B 1/0458* (2013.01); *H04B 1/18* (2013.01); *H04B 1/40* (2013.01); *H04B 1/44* (2013.01); *H03F 2200/387* (2013.01); *H03F 2200/451* (2013.01); *H03F 2203/7212* (2013.01); *H03G 2201/106* (2013.01)

(58) Field of Classification Search
CPC ................ H03F 3/19; H03F 2200/451; H03F 2200/387; H03F 2203/7212; H03F 3/72
See application file for complete search history.

(56) References Cited

U.S. PATENT DOCUMENTS

| | | | |
|---|---|---|---|
| 6,408,069 B1* | 6/2002 | Furlong | H04M 1/58 379/394 |
| 7,649,418 B2 | 1/2010 | Matsui | |
| 7,952,433 B2 | 5/2011 | An et al. | |
| 8,446,143 B2* | 5/2013 | Whittington | G01R 35/002 324/74 |
| 2003/0058041 A1 | 3/2003 | Koizumi | |
| 2011/0256857 A1 | 10/2011 | Chen et al. | |
| 2016/0248462 A1* | 8/2016 | Danilenko | H04B 1/12 |

OTHER PUBLICATIONS

"ARA05050 Reverse Amplifier with Step Attenuator Data Sheet", Skyworks Solutions, Inc., 2016, <http://www.skyworksinc.com/uploads/documents/ARA05050_204227B.pdf> [retrieved from the Internet on Dec. 15, 2017].

"ARA2000 Address-Programmable Reverse Amplifier with Step Attenuator Data Sheet", Skyworks Solutions, Inc., 2016, <http://www.skyworksinc.com/uploads/documents/ARA2000_204228B.pdf> [retrieved from the Internet on Dec. 15, 2017].

"BGA3131 DOCSIS 3.1 upstream amplifier Product data sheet", NXP Semiconductors N.V., 2016, <https://www.nxp.com/docs/en/data-sheet/BGA3131.pdf> [retrieved from the Internet on Dec. 12, 2017].

"DOCSIS 3.0 Upstream Amplifier", Maxim, 2009, <https://media.digikey.com/pdf/Data%20Sheets/Maxim%20PDFs/MAX3518.pdf> [retrieved from the Internet on Dec. 15, 2017].

* cited by examiner

REDUCING IMPEDANCE DISCONTINUITIES ON A SHARED MEDIUM

CROSS-REFERENCE TO RELATED APPLICATIONS

This application claims the benefit under 35 U.S.C. § 119(e) of U.S. Provisional Patent Application No. 62/421,084 titled REDUCING IMPEDANCE DISCONTINUITIES ON A SHARED MEDIUM filed on Nov. 11, 2016, which is herein incorporated by reference in its entirety for all purposes.

This application further relates to U.S. patent application Ser. No. 15/808,486 filed on Nov. 9, 2017, and titled HIGH-LINEARITY VARIABLE GAIN AMPLIFIER WITH BYPASS PATH, which claims the benefit under 35 U.S.C. § 119(e) of U.S. Provisional Patent Application No. 62/420,326 titled HIGH-LINEARITY VARIABLE GAIN AMPLIFIER WITH BYPASS PATH filed on Nov. 10, 2016, each of which is herein incorporated by reference in its entirety for all purposes.

This application further relates to U.S. patent application Ser. No. 15/808,341 filed on Nov. 9, 2017, and titled WIDE DYNAMIC RANGE AMPLIFIER SYSTEM, which claims the benefit under 35 U.S.C. § 119(e) of U.S. Provisional Patent Application No. 62/420,875 titled WIDE DYNAMIC RANGE AMPLIFIER SYSTEM filed on Nov. 11, 2016, each of which is herein incorporated by reference in its entirety for all purposes.

This application further relates to U.S. patent application Ser. No. 15/808,389 filed on Nov. 9, 2017, and titled AMPLIFIER SYSTEM WITH DIGITAL SWITCHED ATTENUATOR, which claims the benefit under 35 U.S.C. § 119(e) of U.S. Provisional Patent Application No. 62/420,681 titled AMPLIFIER SYSTEM WITH DIGITAL SWITCHED ATTENUATOR filed on Nov. 11, 2016, each of which is herein incorporated by reference in its entirety for all purposes.

This application further relates to U.S. patent application Ser. No. 15/808,372 filed on Nov. 9, 2017, and titled TRANSIENT OUTPUT SUPPRESSION IN AN AMPLIFIER, which claims the benefit under 35 U.S.C. § 119(e) of U.S. Provisional Patent Application No. 62/420,907 titled TRANSIENT OUTPUT SUPPRESSION IN AN AMPLIFIER filed on Nov. 11, 2016, each of which is herein incorporated by reference in its entirety for all purposes.

This application further relates to U.S. patent application Ser. No. 15/808,458 filed on Nov. 9, 2017, and titled TEMPERATURE COMPENSATED OSCILLATOR, which claims the benefit under 35 U.S.C. § 119(e) of U.S. Provisional Patent Application No. 62/420,806 titled TEMPERATURE COMPENSATED OSCILLATOR filed on Nov. 11, 2016, each of which is herein incorporated by reference in its entirety for all purposes.

BACKGROUND

Certain communications networks, such as cable networks, use a common or shared communications medium over which data is transmitted and received between various devices. A mismatch between the impedance of the communications system and the shared medium can cause undesirable signal reflections to propagate onto the shared medium leading to an increase in signal degradation and errors. Various communication systems, such as cable modems, include transceivers that operate in different modes at various times. When operating in these different modes or transitioning between them, an impedance mismatch can develop or worsen. Accordingly, a need exists for systems and methods that reduce the impact of reflected signals caused by an impedance mismatch between a communications system and shared medium regardless of the mode of operation that the communications system is operating in.

SUMMARY

Aspects and examples are directed to transmitter, receiver, and transceiver systems and modules. Specifically, the following disclosure is directed to maintaining the output impedance presented by such a transmitter, receiver, or transceiver system, and modules for mitigating the effects of unwanted signal reflections or spurious emissions that can degrade performance, such as by increasing error rates and decreasing transmission speed.

According to one aspect, provided is a method for reducing impedance changes and signal reflections in a communications system. In various examples, the method includes connecting an output to a load path presenting a first output impedance configured to match an impedance of a shared communications medium, the output configured to be coupled to the shared communications medium; enabling a transmission amplifier within a transmission path of the communications system; determining whether the transmission amplifier is operatively configured to provide the transmission signal; disconnecting the output from the load path; and connecting the output to the transmission path responsive to a determination that the transmission amplifier is operatively configured to provide the transmission signal, the transmission path configured to present a second output impedance matching the impedance of the shared communications medium.

In various examples, the method further includes providing the transmission signal to the output. According to some examples, the method further includes determining that the transmission amplifier is no longer operatively configured to provide the transmission signal; and disconnecting the output from the transmission path responsive to the determination that the transmission amplifier is no longer operatively configured to provide the transmission signal. The method may also further include disabling the transmission amplifier. In various examples, the method further includes reconnecting the output to the load path in response to determining that the communications system is no longer operatively configured to provide the transmission signal.

In certain examples, the method further includes enabling a receiving amplifier within a receiving path of the communications system; and determining whether the receiving amplifier is operatively configured to receive signals from the output. According to some examples, the method further includes connecting the output to the receiving path in response to determining that the receiving amplifier is operatively configured to receive signals from the output. The method may also include receiving a signal at the load path from the output; attenuating the signal to produce an attenuated signal; and providing the attenuated signal to the output. In various examples, receiving the signal at the load path from the output further includes receiving the signal at an adjustable attenuator, and wherein attenuating the signal further includes using the adjustable attenuator with at least one cell operating in an isolation mode.

According to some examples, the method further includes receiving a signal at the load path from the transmission amplifier; attenuating to signal to produce an attenuated signal; and providing the attenuating signal to the transmission amplifier. The method may also include receiving the signal at an adjustable attenuator, and wherein attenuating the signal further includes using the adjustable attenuator with at least one cell operating in an isolation mode.

According to another aspect, provided is a transmitter system having an output configured to match an impedance of a shared communications medium. The transmitter system includes a transmission amplifier configured to be coupled to the output and provide a transmission signal to the output in a first mode of operation, the transmission amplifier being configured to present a first output impedance substantially matching the impedance of the shared communications medium; a load path configured to be coupled to the output in a second mode of operation and present a second output impedance substantially matching the impedance of the shared communications medium; switching circuitry configured to selectively couple one of the transmission amplifier and the load path to the output; and a controller configured to receive an indication that the transmitter system is to transition between the first and second modes of operation, and in response to receiving the indication, to control the switching circuitry to either decouple the transmission amplifier from the output and couple the load path to the output, or to decouple the load path from the output and couple the transmission amplifier to the output.

In various examples, the load path is further configured to attenuate signals received from the output in the second mode of operation and to provide attenuated signals to the shared communications medium via the output, the attenuated signals having a lower magnitude than the signals received from the output. According to certain examples, the load path includes an adjustable attenuator. In some examples, the adjustable attenuator is a digital switched attenuator including at least one attenuator cell operating in an isolation mode.

In various additional examples, the load path is further configured to attenuate signals received from the transmission amplifier in the second mode of operation and to provide attenuated signals to the transmission amplifier, the attenuated signals having a lower magnitude than the signals received from the transmission amplifier. The load path may include an adjustable attenuator and in certain examples, the adjustable attenuator is a digital switched attenuator including at least one attenuator cell operating in an isolation mode.

According to another aspect, provided is a transceiver system having an output configured to match an impedance of a shared communications medium, comprising: a transmission amplifier configured to be coupled to the output and provide a transmission signal to the output in a first mode of operation, the transmission amplifier being configured to present a first output impedance substantially matching the impedance of the shared communications medium; a load path configured to be coupled to the output in a second mode of operation and present a second output impedance substantially matching the impedance of the shared communications medium; receiving circuitry configured to be coupled to the output and receive a reception signal from the output in a third mode of operation, the receiving path being configured to present a third output impedance substantially matching the impedance of the shared communications medium; switching circuitry configured to selectively couple one of the transmission amplifier, the receiving circuitry, and the load path to the output; and a controller configured to receive an indication that the transmitter system is to transition among the first, second, and third modes of operation, and in response to receiving the indication, to control the switching circuitry to decouple the transmission amplifier from the output and couple the load path to the output, to decouple the load path from the output and couple the transmission amplifier to the output, to decouple the receiving circuitry from the output and couple the load path to the output, or to decouple the load path from the output and couple the receiving circuitry to the output.

In various examples, the load path is further configured to attenuate signals received from the output in the second mode of operation and to provide attenuated signals to the shared communications medium via the output, the attenuated signals having a lower magnitude than the signals received from the output. In certain other examples, the load path includes an adjustable attenuator including at least one attenuator cell operating in an isolation mode. In some examples, the load path is further configured to attenuate signals received from the transmission amplifier in the second mode of operation and to provide attenuated signals to the transmission amplifier, the attenuated signals having a lower magnitude than the signals received from the transmission amplifier. According to certain examples, the load path includes an adjustable attenuator including at least one attenuator cell operating in an isolation mode.

Furthermore, in the event of inconsistent usages of terms between this document and documents incorporated herein by reference, the term usage in the incorporated references is supplementary to that of this document; for irreconcilable inconsistencies, the term usage in this document controls.

These exemplary aspects, examples, and embodiments are discussed in detail below, along with other aspects, examples, embodiments, and advantages. Examples and embodiments disclosed herein may be combined with other examples or embodiments in any manner consistent with at least one of the principles disclosed herein, and references to "an example," "some examples," "an alternate example," "various examples," "one example", "implementations", "embodiments", or the like are not necessarily mutually exclusive and are intended to indicate that a particular feature, structure, or characteristic described may be included in one or more examples or implementations. The appearances of such terms herein are not necessarily all referring to the same example or implementation.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Figure 1:
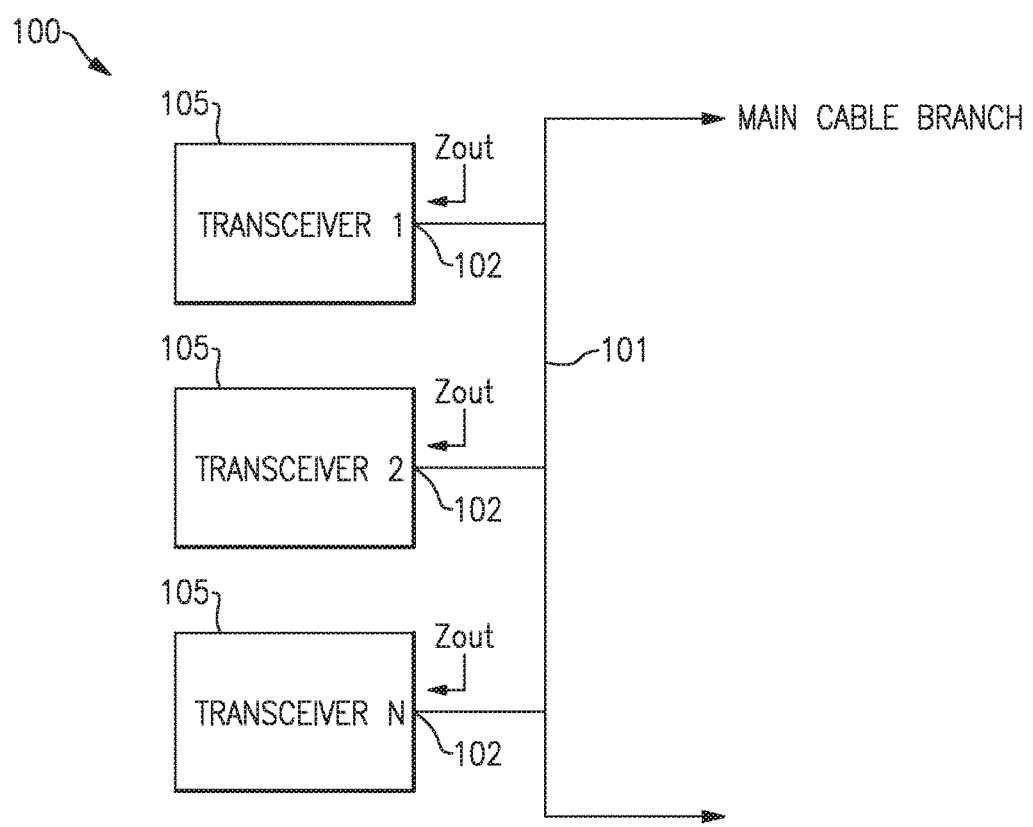
FIG. 1 is a block diagram showing a two-way communications system using a shared communications medium.

Modern communications devices include one or transceivers on their front end to switch between various circuitry depending on whether the communications devices are transmitting a signal, receiving a signal, or operating in another mode such as a standby mode. One example of a modern communications device featuring at least one transceiver is a cable modem, which operates in accordance with a communications standard such as the Data Over Cable Service Interface Specification (DOCSIS) 3.0 or 3.1 standards. Cable infrastructure includes various shared communications mediums that relay signals to and from the cable modems of many different customers simultaneously.

It is important for the impedance presented by each customers' cable modem to substantially match the impedance presented by the shared communications medium since a lack of matching between these two impedances can cause unwanted signal reflections and spurious emissions to propagate from transceivers onto the shared communications medium. These signal reflections and spurious emissions can interfere with the existing communications signals travelling along the medium causing data loss, signal degradation, and other undesirable effects. Circuit designers can design the various circuit paths within transceivers to present a predictable output impedance when operating in a known state.

However, at times when the transceiver is switching between modes of operation the output impedance it presents can fluctuate unpredictable or uncontrollably. Accordingly, techniques are provided herein for reducing impedance variations when a transceiver is transitioning between modes of operation and would not otherwise present a known or "well behaved" impedance.

In some situations, it is impossible or impractical to fully stabilize or control the output impedance, such as during a transition between transceiver modes of operation. Under these conditions, the undesirable effects of an impedance mismatch described above (signal reflections or spurious emissions) cannot be avoided entirely. To address this issue, it is possible to reduce the effect of undesirable signal reflections or spurious emissions by attenuating the reflected signal or spurious emission before it can exit the transceiver and propagate back on to the shared communications medium. Accordingly, techniques are also provided herein for attenuating unwanted signal reflections and spurious emissions caused by an impedance mismatch until the impedance can be returned to a known or well-behaved state.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

FIG. 1 is a block diagram illustrating a bi-directional communications system 100 using a shared communication medium 101. For example, the communications system 100 may be a cable network using a shared coaxial cable as the shared communication medium 101. The shared communication medium 101 is communicatively coupled to each of a plurality of transceivers 105 at a respective input/output terminal 102. Each of the transceivers 105 may include circuitry for transmitting or receiving data, which circuitry may be provided in separate transmission and receiving circuits or modules, or which may be provided in a common circuit or module.

As illustrated, each of the transceivers 105 presents an output impedance $Z_{out}$ at its respective terminal 102. Those skilled in the art may appreciate that the output impedance $Z_{out}$ at each terminal 102 may vary responsive to transient behavior inside each corresponding transceiver 105. For example, the output impedance $Z_{out}$ of a transceiver 105 may vary depending on whether the transceiver 105 is transmitting, receiving, transmitting and receiving, is in a sleep or standby mode, or is powered on or off (referred to herein as changes in "states" or "modes" of operation). The output impedance $Z_{out}$ of a transceiver 105 may further vary if the transceiver 105 is transitioning between one or more of these modes of operation ("transient" behavior). A change in a state may further occur while the transceiver 105 is continuing to operate within the same operating mode. For example, while transmitting or receiving, the transceiver 105 may change an amount of gain being produced by one or more transmission or receiving amplifiers (e.g. a change of "gain state"), which may similarly affect the output impedance $Z_{out}$.

Such transient variation in the output impedance $Z_{out}$ of one of the transceivers 105 may affect the operation of other transceivers 105 that are connected to the shared communication medium 101 and may further affect properties of the shared communication medium 101 itself. Accordingly, the output impedance $Z_{out}$ at each of the terminals 102 coupled to the shared medium 101 may be varied by transient behavior affecting the shared medium 101 causing a change in the behavior of the overall communications system 100.

The systems and method disclosed herein may be used to configure each transceiver 105 to exhibit a substantially identical output impedance $Z_{out}$ and minimize transient variations in the output impedances of specific transceivers 105 in order to, for example, reduce unwanted signal reflections on the shared communications medium 101. These unwanted signal reflections may increase bit error rate and adversely affect transmission speeds. In particular, various aspects and embodiments are directed to transceivers which actively control switch timing between a transmission state of operation, a receiving state of operation, and one or more other states of operation of the transceiver.

FIGS. 2 and 3A-3E are block diagrams illustrating various transceivers 205, such as one of the transceivers 105 illustrated in FIG. 1. Each of the transceivers 205 includes an input/output terminal 102 (sometimes referred to simply as an "output terminal" as described herein) that couples the transceiver 205 to a communications medium, such as the shared communications medium 101 illustrated in FIG. 1. Switching circuitry 210 is used to control coupling between at least one signal path 221, 222, and 223, and the output terminal 102. In various embodiments as depicted in FIGS. 2 and 3A-3E, the transceiver 205 may include two or more signal paths depending on the configuration. A controller 252 may be further included and coupled to the switching circuitry 210, such that the controller 252 may send control signals to control which signal path 221, 222, and/or 223 is coupled to the output terminal 102.

For example, in FIGS. 2 and 3A-3C, the transceiver 205 includes three distinct signal paths 221, 222, and 223. Alternatively, in FIGS. 3D-3E, the transceiver 205 includes two distinct signal paths 221, and 222 or 223. It should be understood that each distinct signal path 221, 222, or 223 includes particular circuitry presenting a particular output impedance $Z_2$, $Z_1$, or $Z_3$, respectively, to the output terminal 102. Specifically, when the signal path 221 is coupled to the output terminal 102, $Z_{out}$ becomes $Z_2$, the impedance presented by the signal path 221. When the signal path 222 is coupled to the output terminal 102, $Z_{out}$ becomes $Z_1$, the impedance presented by the signal path 222. When the signal path 223 is coupled to the output terminal 102, $Z_{out}$ becomes $Z_3$, the impedance presented by the signal path 223. Two different signal paths 221, 222, or 223 may include at least some circuitry that is common to each signal path but otherwise include at least some different circuitry. Two different signal paths 221, 222, or 223 may also include at least some circuitry that is common to each path, but is being operated in different modes when connected to each respective signal path thus causing the circuitry to present a different impedance when connected to different signal paths. Examples of such circuitry will be described in greater detail below with respect to FIGS. 4A-4C and 8-9.

Figure 2:
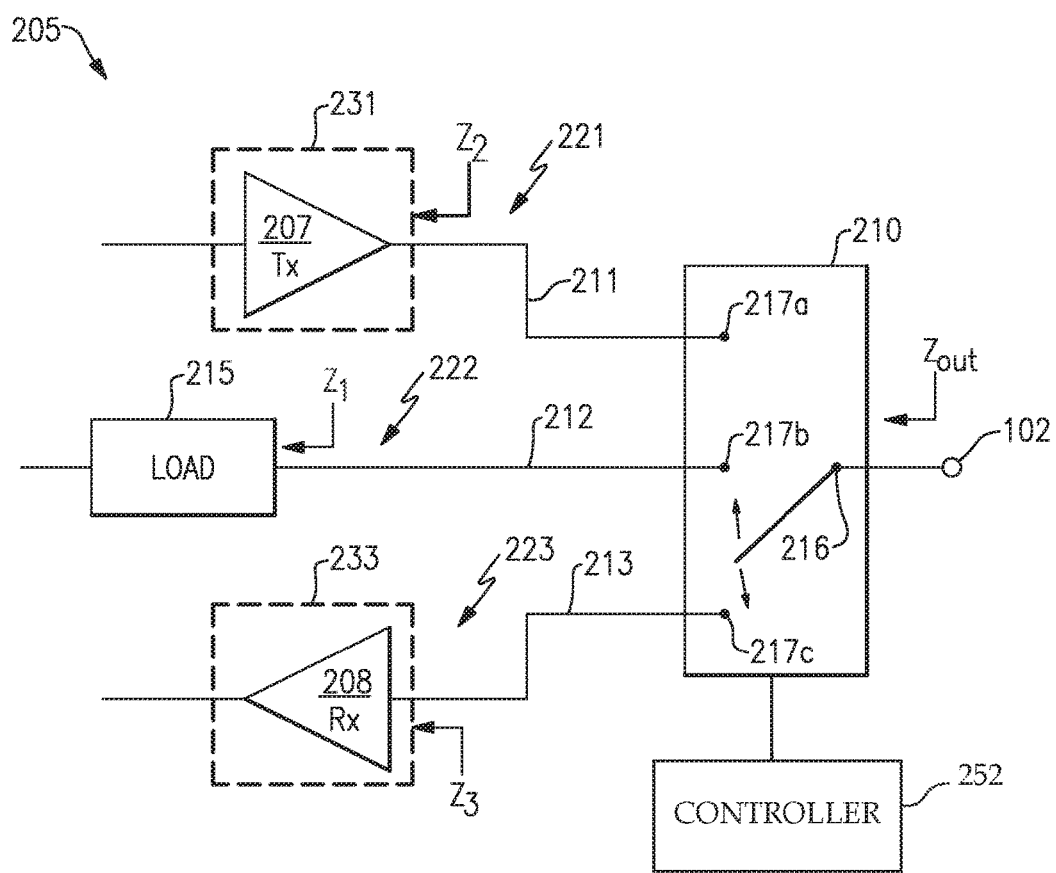
FIG. 2 is a block diagram showing an embodiment of a transceiver having a switching circuit capable of switching between a plurality of signal paths.

FIG. 2 is a block diagram depicting a transceiver 205. The transceiver 205 is configured to provide and maintain an output impedance $Z_{out}$ that substantially matches the impedance of an external communication medium, such as the shared communications medium 101 illustrated in FIG. 1. This "impedance matching" reduces unwanted reflections or spurious emissions when the transceiver 205 is connected to the external communication medium. The transceiver 205 includes multiple signal paths 221, 222, 223, and is configured to couple one of the signal paths 221, 222, 223 to the external communications medium via the output terminal 102. Each of the signal paths 221, 222, 223 has corresponding circuitry, such as transmission circuitry 231, receiving circuitry 233, or a load 215 as illustrated in FIG. 2. One or more switching circuits 210 are configured to couple the input/output terminal 102 of the transceiver 205 to one of a plurality of signal lines 211, 212, 213, each signal line connecting to a respective signal path 221, 222, 223 (and respective circuitry 231, 215, 233). In some embodiments, the transceiver 205 may include more or less than three signal paths and corresponding signal lines. The terminal 102 has an output impedance $Z_{out}$ looking into the transceiver 205.

In various embodiments, the transceiver 205 is configured to dynamically control the one or more switching circuits 210 such that a stable output impedance $Z_{out}$ is maintained at the input/output terminal 102. In particular, when switching between one or more states of operation (e.g., a transmission state, a receiving state, a sleep state, etc.) the transceiver 205 may wait for a period of time sufficient to ensure that the circuitry corresponding to the new state of operation is in a valid operating state or "steady" state, prior to controlling the one or more switching circuit 210 to connect to the circuity of the new state of operation.

In some embodiments, signal line 211 couples to a signal transmission path 221 including the transmission circuitry 231. As illustrated the transmission circuitry 231 may include a transmission (TX) amplifier 207, such as a power amplifier. The transmission circuitry 231 has an output impedance $Z_2$ looking into the transmission amplifier 207. The transmission circuitry 231 is configured to apply a gain to a signal during the transmission state of operation.

Similarly, signal line 213 may couple to a signal receiving path 223 including a receiving circuitry 233. As illustrated, the receiving circuitry 233 may include receiving (RX) amplifier 208, such as a low noise amplifier. The receiving circuitry 223 has an output impedance $Z_3$ looking into the receiving amplifier 208. The receiving circuitry 231 is configured to apply a gain to a signal during the receiving state of operation. Signal line 212 may couple to a signal path 222 having a load 215. The load 215 has an output impedance $Z_1$ looking into the load 215. As described in detail further below, the load 215 may be one of a terminating impedance that matches an impedance of the shared communications medium 101 of FIG. 1, a signal path, or an attenuator that provides attenuation and a matching impedance to match the impedance of the shared communications medium 101.

The switching circuit 210 includes one or more switches. For instance FIG. 2 illustrates a single switch which includes a plurality of contacts 216, 217a, 217b, 217c. Control signals provided to the switching circuit 210 by a control circuit (e.g., controller (not shown)) cause the switching circuit 210 to electrically connect the contact 216 to one of the contacts 217a, 217b, and 217c. The particular position of the switching circuit 210 depends on the state of operation of the transceiver 205. While, the particular switching circuit 210 illustrated in FIG. 2 is depicted as a single-pole triple-throw (SPTT) switch, alternate switching topologies may be used to control coupling between the terminal 102 and a respective signal line 211, 212, or 213. For example, a single-pole double-throw (SPDT) switch may be used to select between signal lines 211 and 212, and a separate single-pole single-throw (SPST) switch may be used to select between signal line 213 and an open circuit.

As discussed, the switching circuit 210 is operable in a plurality of connection states to couple the terminal 102 to one of the signal lines 211, 212, or 213. Each connection state corresponds a particular arrangement of connections. For example, referring to the switching circuit 210 depicted in FIG. 2, when the contact 216 is connected to the contact 217a, the switching circuit 210 electrically couples terminal 102 to signal line 211, such that $Z_{out}$ substantially equals $Z_2$ (plus-or-minus any impedance added by the switching circuit 210). Such an arrangement occurs during the transmission state of operation.

When the contact 216 is connected to the contact 217b, the switching circuit 210 electrically couples terminal 102 to signal line 212, such that $Z_{out}$ substantially equals $Z_1$ (plus-or-minus any impedance added by the switching circuit 210). Such an arrangement may occur during a load state, a sleep state, a power-up state, or a power-down state of operation.

Lastly, when the contact 216 is connected to the contact 217c, the switching circuit 210 electrically couples terminal 102 to signal line 213, such that $Z_{out}$ substantially equals $Z_3$ (plus-or-minus any impedance added by the switching circuit 210). Such an arrangement occurs during the receiving state of operation. In various embodiments, the switching circuit 210 adds negligible impedance that can effectively be ignored relative to the value of $Z_1$, $Z_2$, or $Z_3$. Accordingly, the output impedance $Z_{out}$ of the transceiver 205 largely depends on the current position of the switching circuit 210 and the current state of operation.

Figure 3A:
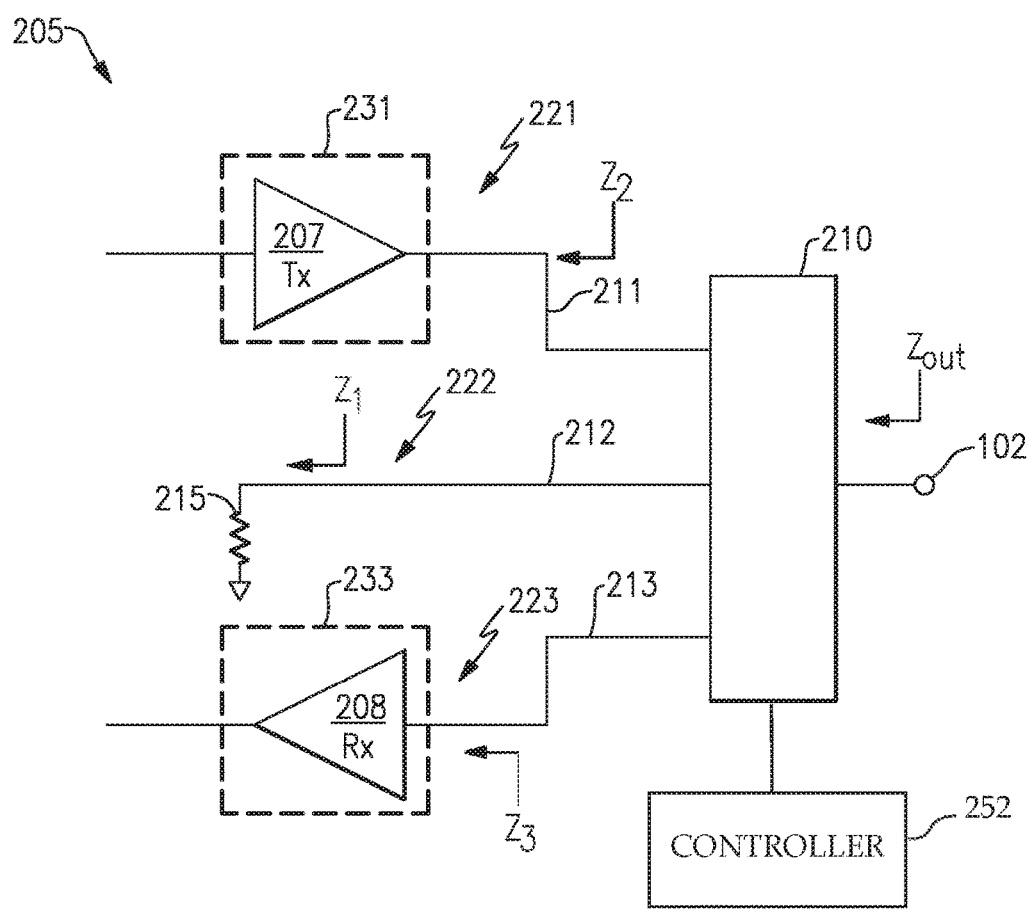
FIGS. 3A-3E are block diagrams showing various embodiments of a transceiver, each embodiment having a switching circuit capable of switching between a plurality of signal paths.
Figure 3B:
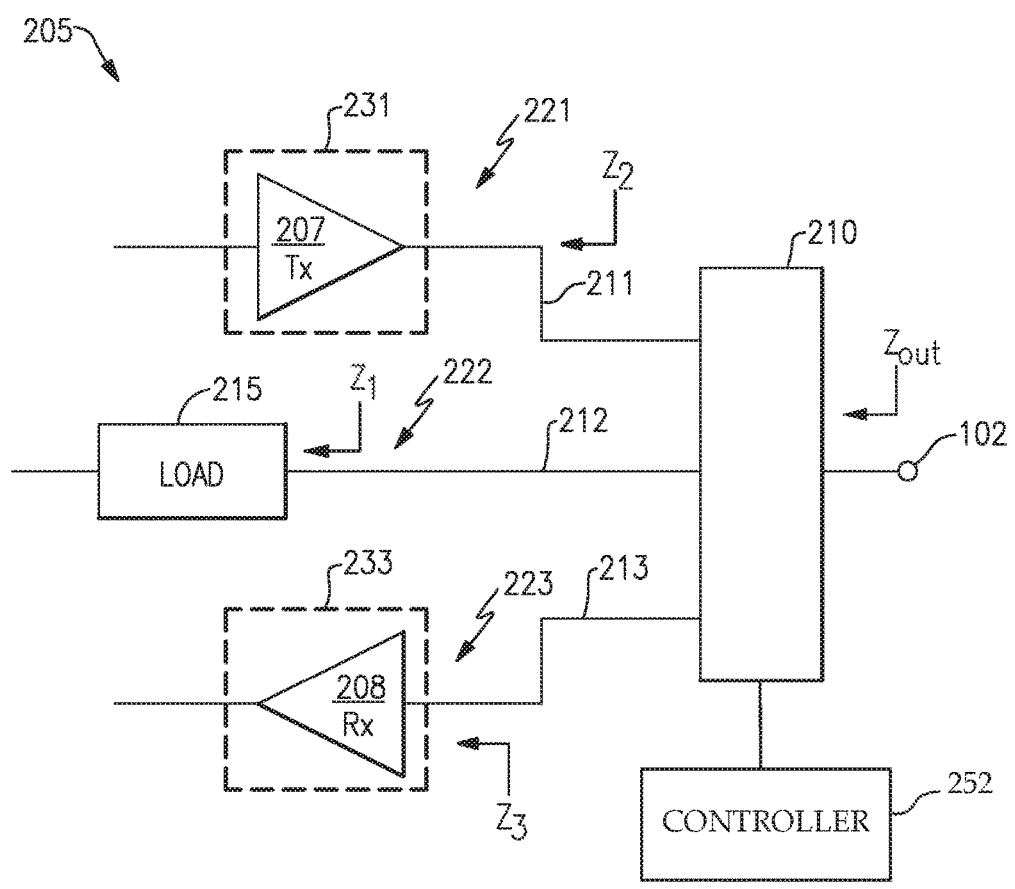
Figure 3C:
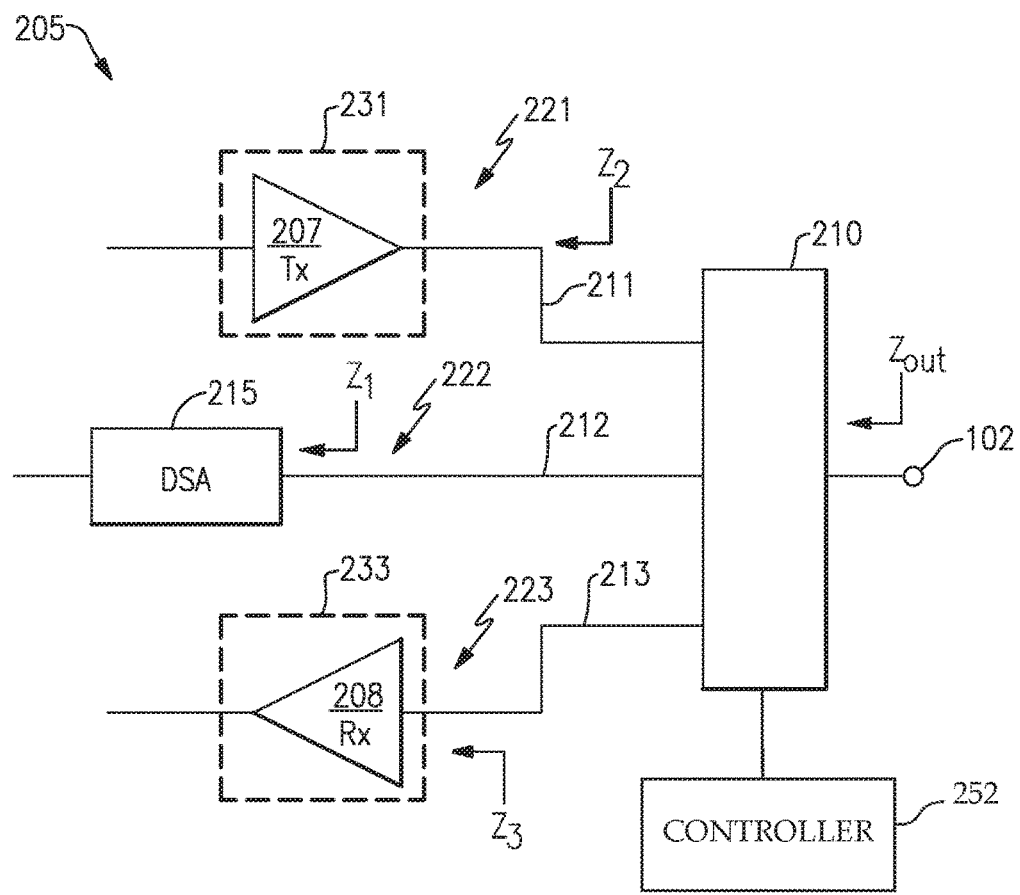

FIGS. 3A-3C show block diagrams illustrating three different embodiments of the transceiver 205 illustrated in FIG. 2. Each of FIGS. 3A-3C includes a transmission signal path 221, a receiving signal path 223, and a third path 222. In each of FIGS. 3A-3C, the third path 222 includes a different type of load 215. For example, in FIG. 3A, the third path 222 includes a resistor 215 having a certain resistance, for example a resistance configured to match the real part of the impedance of a shared communications medium (e.g., the shared communications medium 101 illustrated in FIG. 1). A capacitor and/or inductor (not shown) may also be disposed in series or in parallel with the resistor 215 to match the imaginary part of the impedance, where appropriate. In FIG. 3B, the third path 222 includes a load 215 that presents an impedance, which can be configured to match an impedance of the shared communications medium 101 illustrated in FIG. 1. The third path 222 may be another signal path other than the transmission signal path 221 and the receiving signal path 223, and include additional circuitry or load elements comprising the load 215. Lastly, in FIG. 3C, the third path 222 includes an adjustable attenuator 215, for example a Digital Signal Attenuator (DSA), which can be configured to provide a matching impedance and attenuation, as is described below with respect to at least FIGS. 8-9.

Figure 3D:
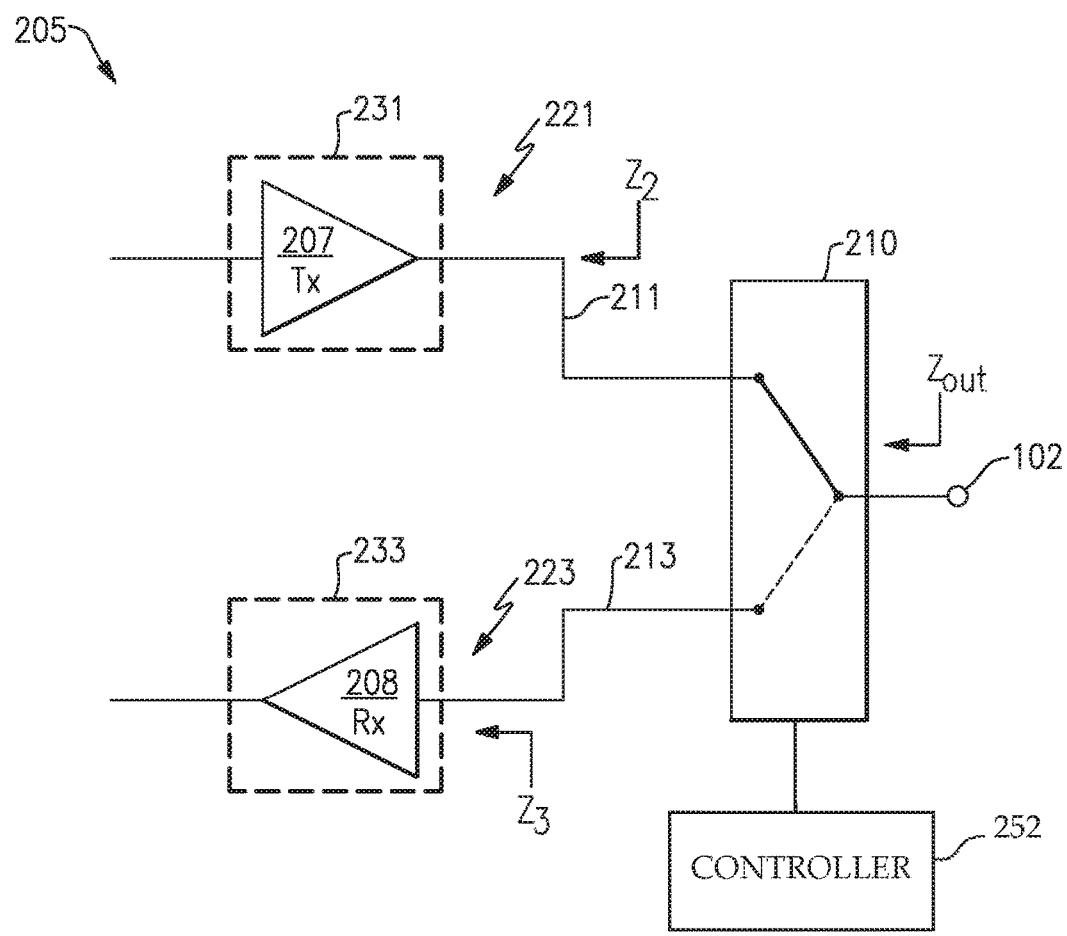
Figure 3E:
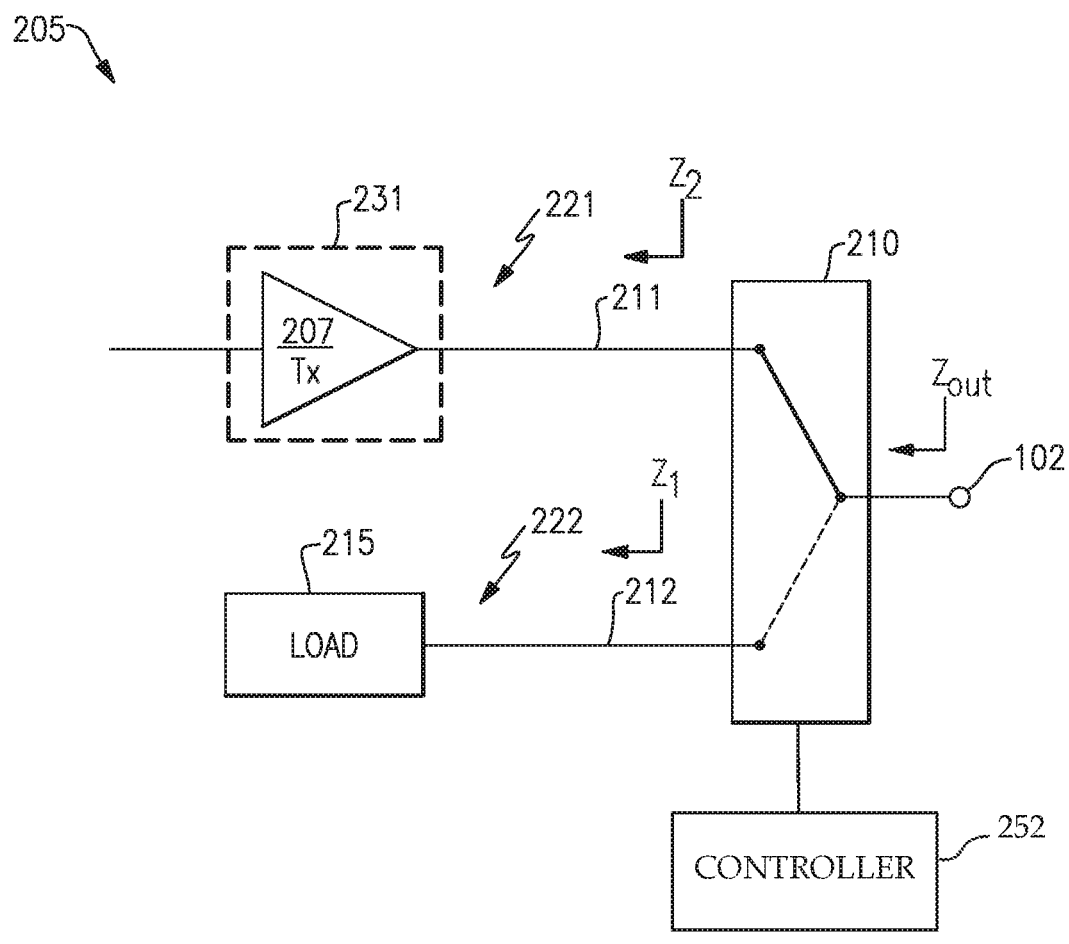

FIGS. 3D-3E are block diagrams illustrating two additional embodiments of the transceiver 205 shown in FIG. 2, each transceiver 205 having two signal paths, namely the transmission signal path 221 and either (1) a receiving signal path 223 including receiving circuitry 233 that presents a certain impedance, or (2) an additional signal path 222 including a load 215 that presents a certain impedance.

In FIG. 3D, the switching circuit 210 is configured to couple the terminal 102 to either the signal line 211 including additional circuitry, such as the transmission circuitry 231, or signal line 213 including additional circuitry, such as the receiving circuitry 233. In FIG. 3E, the switching circuit 210 is configured to couple the terminal 102 to either the signal line 211 or to the signal line 212 including a load 215. In FIG. 3E the signal line 212 is coupled to the load 215, which as discussed above in FIGS. 3A-3C, may be an impedance, a signal path other than the transmission signal path 221 (for example, a receiving signal path, alternate transmission path, or other type of communication signal path), or an attenuator that provides attenuation as well as a matching impedance as discussed above with respect to FIGS. 3A-3C.

In each of the embodiments of FIGS. 3A-3E, the switching circuit 210 may be controlled to isolate the transmission or receiving circuits 231, 233 from the terminal 102 (and any communication medium 101 coupled to terminal 102, such as the shared coaxial cable described in FIG. 1) during one or more changes in the operation of the transceiver 205. Moreover, the load 215 may be selectively coupled and decoupled to the terminal 102 by the switching circuitry 210 to transition between the transmission circuitry 231 and receiving circuitry 233 (or vice versa) during the one or more state changes. However, in other embodiments, the load 215 need not be directly connected to the terminal 102 by the switching circuit 210, as further described with respect to FIGS. 4A-4C. Various processes for transitioning between the transceiver states of operation, and stabilizing the output impedance $Z_{out}$ thereof, are discussed herein with reference to FIGS. 6 and 7.

Figure 4A:
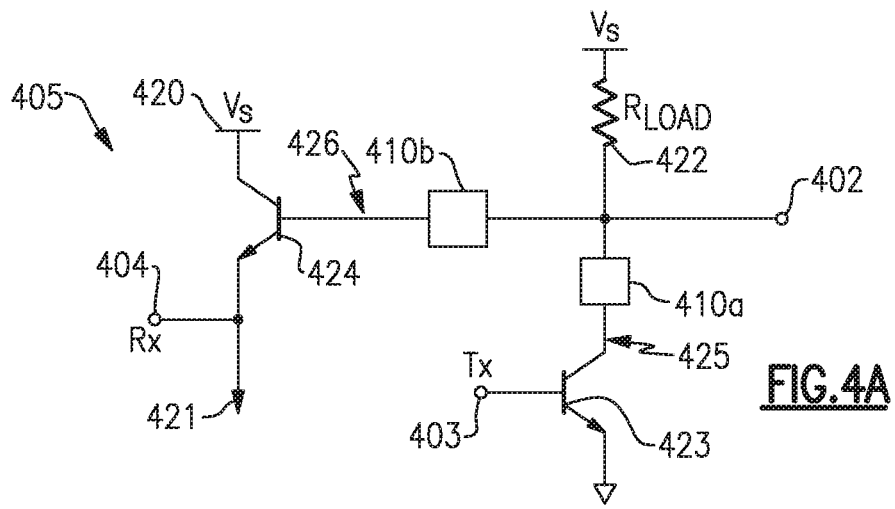
FIGS. 4A-4C are schematics showing various embodiments of a transceiver, each embodiment having a plurality of switching circuits and being coupled to a load.

FIG. 4A illustrates another example of a transceiver 405 according to aspects of the present disclosure, the transceiver 405 being coupled to a load 422 ($R_{load}$). In particular, the transceiver 405 is illustrated as including a first switching circuit 410a which couples a first signal path to an input/output terminal 402 and a second switching circuit 410b which couples a second signal path to the input/output terminal 402. In certain examples, the first switching circuit 410a may couple a transmission path 425 to the terminal 402 and the second switching circuit 410b may couple a receiving path 426 to the terminal 402. Each of the transmission path 425 and the receiving path 426 may have corresponding transmission circuitry and receiving circuitry, respectively. For instance, FIG. 4A shows the transmission path 425 including at least one output transistor 423 and the receiving path 425 including at least one input transistor 424.

In various embodiments, the terminal 402 may be coupled to a shared communications medium, such as the cable network using a shared coaxial cable as shown in FIG. 1. The terminal 402 also is coupled to the load 422, which may provide a suitable termination impedance, such as a termination impedance matching the impedance of the shared communications medium. In the illustrated example of FIG. 4A, each switching circuit 410a, 410b is depicted as being a SPST switch; however, those skilled in the art will appreciate that other switching circuits sufficient to switch between an electrical connection and an open circuit may be used as well. Each of the switching circuits 410a and 410b may be operated, such that when switching circuit 410a is open, switching circuit 410b is closed, and when switching circuit 410a is closed, switching circuit 410b is open.

Figure 4B:
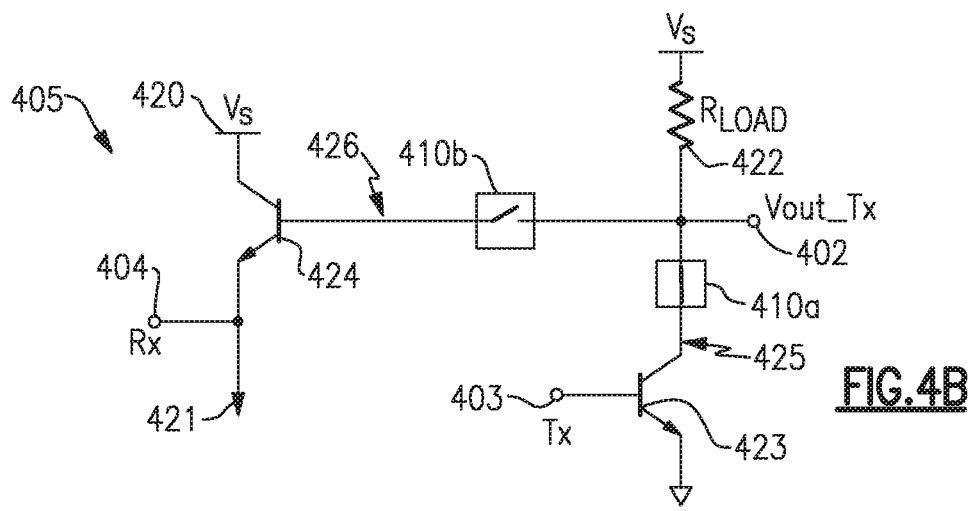
Figure 4C:
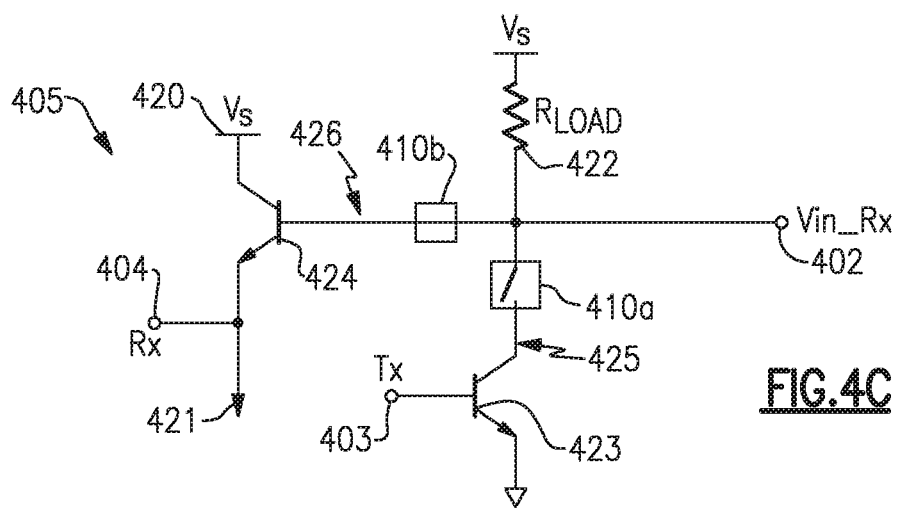

FIGS. 4B-4C schematically illustrate two operating states of the transceiver 405 as shown in FIG. 4A. FIG. 4B illustrates the transceiver 405 in a transmission state. In FIG. 4B, the switching circuit 410a is configured to couple the terminal 402 to the transmission signal path 425, the transmission signal path 425 including the least one output transistor 423, such as an output transistor of a transmission amplifier (e.g., a power amplifier). During the transmission state, the switching circuit 410*b* decouples the terminal 402 from the input transistor 424 of the receiving signal path 426. In addition to being coupled to the transmission signal path 425, the terminal 402 is connected to the load 422 during the transmission state.

FIG. 4C, illustrates the transceiver during a receiving state. In FIG. 4C the switching circuit 410*b* is configured to couple the terminal 402 to the receiving signal path 426, the receiving signal path 426 including the at least one input transistor 424, which may include the input transistor of a receiving amplifier (e.g. a low noise amplifier). In the receiving state, the switching circuit 410*a* decouples the terminal 402 from the transmission path 425. In addition to being coupled to the receiving signal path 426, the terminal 402 is connected to the load 422 in the receiving state. Accordingly, irrespective of the state of transceiver 405, and the position of the switching circuits 410*a* and 410*b*, the load 422 is electrically connected to the terminal 402. Accordingly, the load 422 may be used by the transceiver to stabilize an output impedance of the transceiver 405 when switching between the transmission state and the receiving state or vice versa, as discussed herein.

Figure 5:
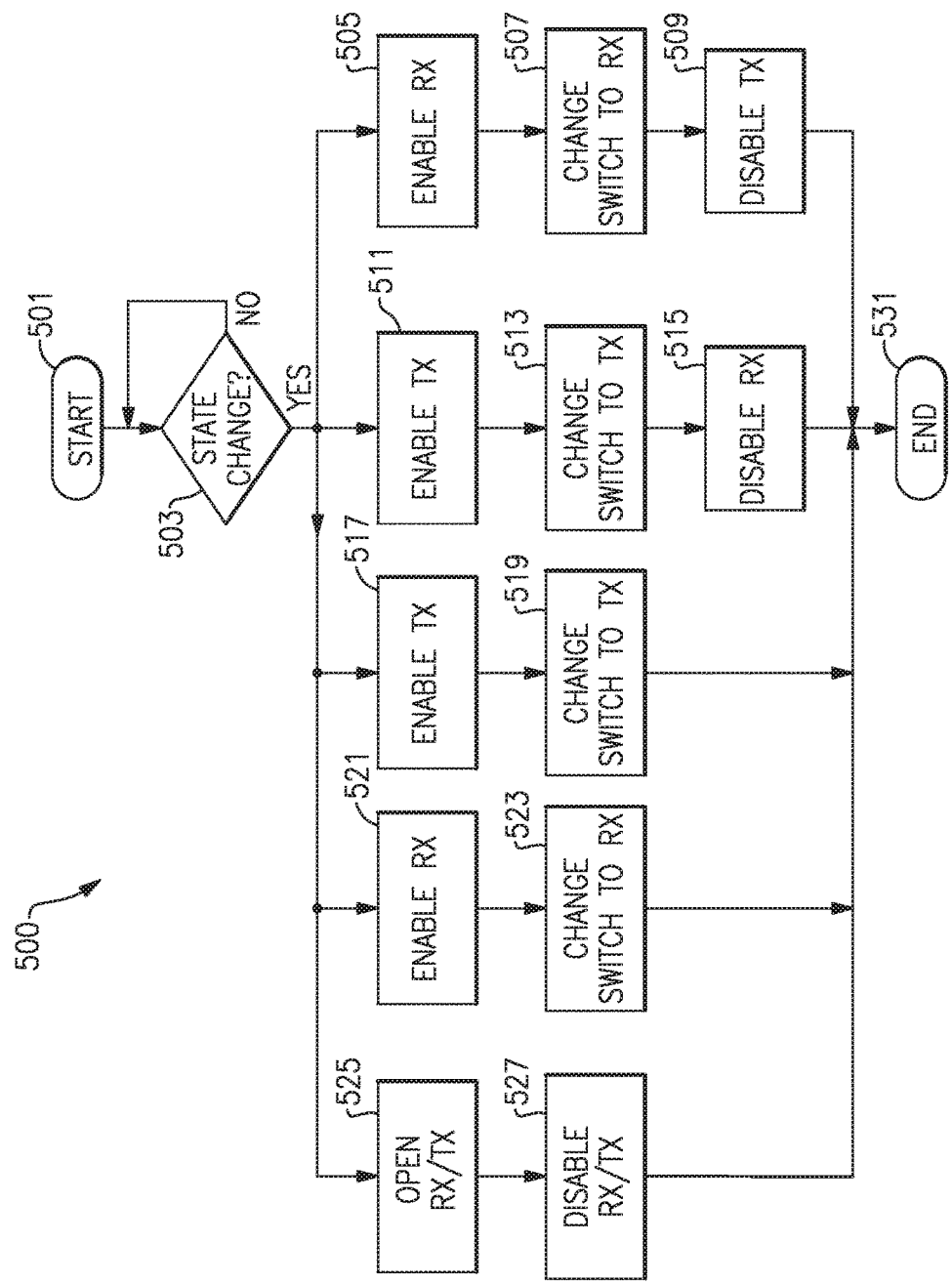
FIG. 5 is a flowchart depicting a method of configuring a plurality signal paths in a transceiver to present a substantially constant output impedance during various operating states.

As described above, several embodiments perform processes that control a switching circuit within a transceiver to switch between a plurality signal paths to stabilize an output impedance. One example of such a process is illustrated in FIG. 5. The process of FIG. 5 is described with continuing reference to the transceiver 405 illustrated in FIGS. 4A-4C, and components thereof.

FIG. 5 is a flowchart illustrating a method of configuring connections in a transceiver having a transmission signal path and a receiving signal path, such as the transceiver 405 illustrated in FIGS. 4A-4C. The method may be implemented by a controller (not shown but described below with respect to FIG. 8) that is operatively coupled to the transceiver 405. The method 500 begins at act 501. At act 503, the controller determines whether to change the state of operation of the transceiver between a first state and a second state, for example, between a sleep state and a transmission state, between a sleep state and a receiving state, between a transmission state and a receiving state, or vice-versa.

In some embodiments, the transceiver is configured to disable its transmission circuitry after switching from the transmission state to the receiving state. Disabling the transmission circuitry of the transceiver when the transceiver is not transmitting may be useful for conserving power and avoiding excess generation of heat. In these embodiments, the controller determines to switch from the transmission state to the receiving state at act 503 and proceeds to act 505. In act 505, the controller enables the receiving circuitry (e.g., receiving circuitry 233 of FIG. 2) via one or more control signals. For example, the controller may enable the receiving amplifier 208 within the receiving circuitry 233 shown in FIG. 2.

In accordance with an aspect of the present disclosure, the controller may wait for a period of time sufficient to ensure that the receiving circuitry is in a valid operating state, and then proceed to act 507. In act 507, the controller controls one or more switching circuits to couple an output terminal of the switching circuit (e.g., terminal 402) to the receiving path instead of the transmission path. The controller then proceeds to act 509 and disables the transmission circuitry via one or more control signals. For example, the controller may disable a transmission amplifier 207 within the transmission circuitry 231 shown in FIG. 2. The method then terminates at act 531.

It should be appreciated that by disabling the transmission circuitry after coupling the output terminal to the receiving path, any spurious outputs or changes in impedance that might be caused by disabling the transmission circuitry are not propagated to the shared communications medium 101 (FIG. 1). Further, by ensuring that the receiving circuitry is in a valid operating state prior to changing the switching circuit from the transmission path to the receiving path, any spurious outputs or changes in impedance that might be caused by enabling the receiving circuitry are not propagated to the shared communications medium 101. Such processes ensure that the output impedance of the output terminal remains constant during the change in states.

In some embodiments, the transceiver 405 is also configured to disable its receiving circuitry after switching from a receive state to a transmission state. For example, the controller may disable the receiving circuitry 233 (e.g., the receiving amplifier 208) of FIG. 2. While receiving amplifiers, such as a low noise amplifier, typically consume less power than a transmission amplifier, disabling the receiving amplifier within the receiving circuitry may also be used to conserve power and avoid generating heat. In these embodiments, the controller determines to switch from the receiving state to transmission state at act 503 and proceeds to act 511 during which the controller first enables the transmission circuitry via one or more control signals.

The controller may then wait for a period of time sufficient to ensure that the transmission circuitry is in a valid operating state. The controller then proceeds to act 513 and controls the one or more switching circuits to couple the output terminal 402 to the transmission path instead of the receiving path. Once the output terminal has been coupled to the transmission path, the controller then proceeds to act 515 and disables the receiving circuitry via one or more control signals (not shown). The method then terminates at act 531.

It should be appreciated that by disabling the receiving circuitry after coupling the output terminal to the transmission path 425, any spurious outputs or changes in impedance that might be caused by disabling the receiving circuitry are not propagated to the shared communications medium 101 (FIG. 1). Further, by ensuring that the transmission circuitry is in a valid operating state prior to changing the switching circuit from receiving path to the transmission path, any spurious outputs or changes in impedance that might be caused by enabling the transmission circuitry are not propagated to a communications medium coupled to output terminal.

FIG. 5 also illustrates two other processes which may be executed by the transceiver to reduce instability in the output impedance $Z_{out}$ of the transceiver. For example, where the transceiver, or a communications system in communication with the transceiver, is operating in a first powered on state, the transceiver may be subsequently placed in a sleep state. In such a situation, the controller in the communications system in which the transceiver is included may be configured to control the switching circuit to operatively decouple the output terminal from both the transmission path 425 and the receiving path 426 when the transceiver is transitioned to sleep state. The sleep state may be entered, for example, when powering down the transceiver or when initially powering up the transceiver or the communication system. When returning from the sleep state, the output impedance may experience instability as a result of the activation of the transmission circuitry and/or receiving circuitry.

Accordingly, when the controller determines to change a state of the transceiver from the sleep state to the transmission state (act 503), the controller may proceed to act 517 and enable the transmission circuitry via one or more control signals. The controller may then wait for a period of time sufficient to ensure that the transmission circuitry is in a valid operating state. The controller may then proceed to act 519, where the controller may control the switching circuit to couple the output terminal of the transceiver to the transmission path. The method then terminates at act 531. Such a process stabilizes the output impedance of the transceiver when transitioning to the transmission state.

Similarly, when the controller determines to change the state of the transceiver from the sleep state to the receiving state (act 503), the controller proceeds to act 521 where the controller enables the receive circuitry via one or more control signals. The controller may then wait a period of time sufficient to ensure that the receiving circuitry is in a valid operating state, after which the controller may proceed to act 523. In act 523, the controller controls the switching circuitry to couple the output terminal of the transceiver to the receiving path. The method then terminates at act 531.

Act 503 may also involve the controller determining that it is time transition from a transmit mode or receive mode to a sleep mode. For example, the controller may determine that it is time to power down or that transmission/receiving activity has concluded and it is time to enter a lower power sleep state. Accordingly, at act 525 the controller controls the switching circuit to decouple the output terminal of the transceiver from whichever one of the receiving path 426 and the transmission path 425 was active. The controller may send signals causing whichever one of switches 410*a* and 410*b* was closed to open. For example, if the receiving path 426 was connected with switch 410*a* open and switch 410*b* closed, the controller sends a signal causing switch 410*b* to open at act 525. Alternatively, if the transmission path 425 was connected with switch 410*b* open and switch 410*a* closed, the controller sends a signal causing switch 410*a* to open at act 525. After opening whichever one of the switches 410*a*, 410*b* that was previously closed, the controller proceeds to act 527. At act 527, the controller next controls the receiving or transmission circuitry (whichever one was previously active) to stop receiving or transmitting, respectively.

As described above with reference to FIG. 2 and FIGS. 3A-3C, several embodiments perform processes that control a switching circuit within a transceiver to switch between a plurality signal paths, each signal path presenting a certain output impedance. In certain examples, when transitioning between signal paths, the controller may instruct the switching circuitry (e.g., switching circuitry 210 of FIG. 2) to switch to a load (e.g., load 215), while one of the transmission circuitry or receiving circuitry is enabled and the other is disabled. Such processes maintain a stable output impedance of the transceiver by transitioning to a stable output impedance of the load. One example of such a process is illustrated in FIG. 6.

According to this example, the process 600 includes acts relating to switching between a transmission state, a receiving state, and a load state. The process of FIG. 6 is described with continuing reference to the transceiver 205 illustrated in FIG. 2 and FIGS. 3A-3C, and components thereof.

Figure 6:
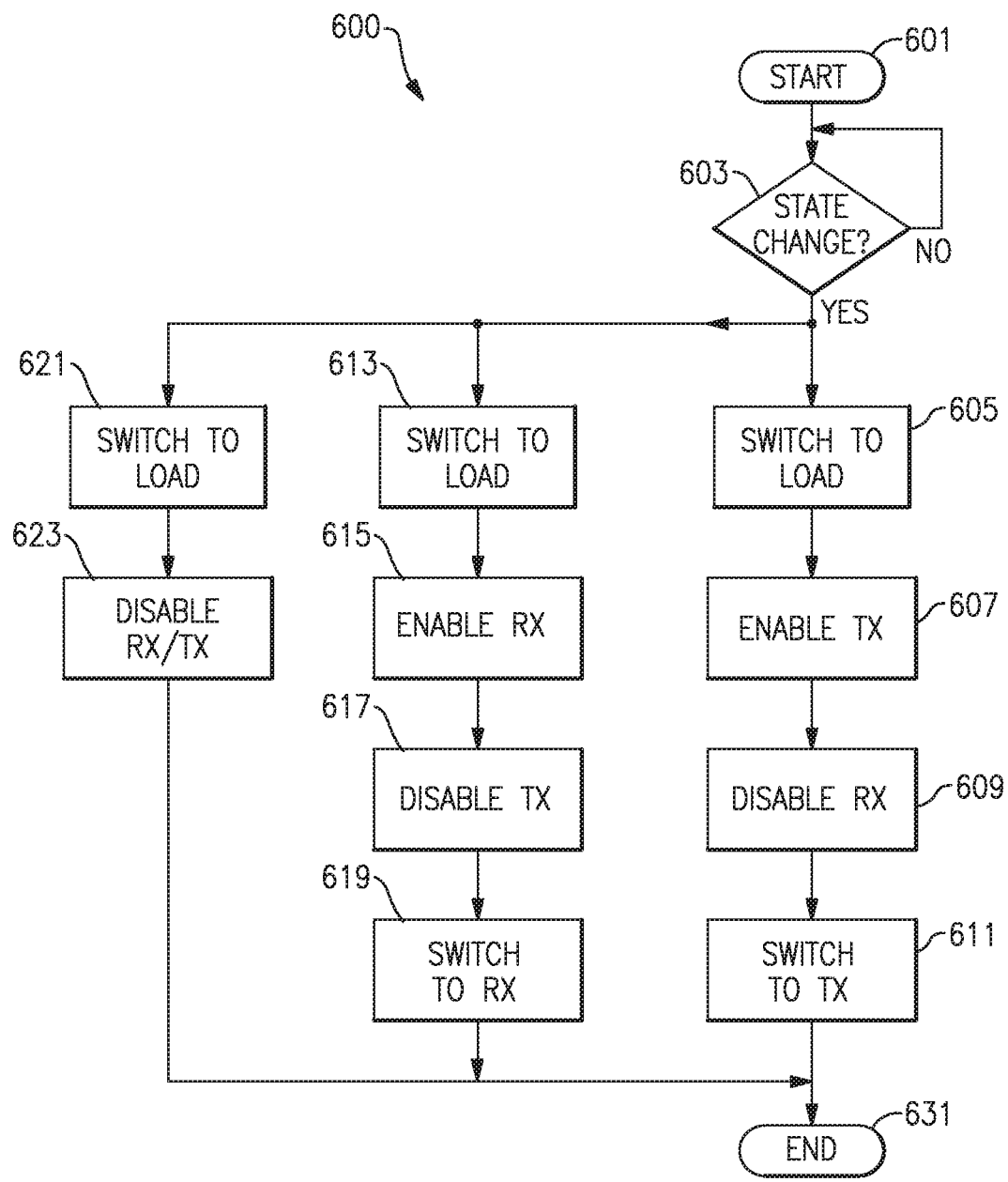
FIG. 6 is a flowchart depicting an additional method of configuring a plurality signal paths in a transceiver to present a substantially constant output impedance during various operating states.

FIG. 6 is a flowchart illustrating a method of configuring the connections in a transceiver (e.g., transceiver 205) having a transmission signal path, a receiving signal path, and a load path, such as the transceiver 205 of FIG. 2. The method begins at act 601. At act 603, a controller determines whether to change a state of operation of the transceiver 205 between one of a transmission state, a receiving state, and a load state. Switching to a load state while transitioning between two active states, such as the transmission state and the receiving state, can help reduce undesirable transient variations in the output impedance presented to a shared communications medium to which the transceiver is operatively connected, as discussed herein.

In some embodiments, the transceiver is configured to switch to the load state when transitioning from the receiving state to the transmission state and from the transmission state to the receiving state. In these embodiments, the controller determines to switch from the receiving state to the transmission state at act 603, and proceeds to act 605 in which the controller controls the switching circuit (e.g., switching circuit 210 of FIG. 2) to couple the output terminal (e.g., terminal 102) to the load path. The controller then proceeds to act 607 and enables the transmission circuitry via one or more control signals. For example, the controller may enable a transmission amplifier 207 within the transmission circuitry 231 illustrated in FIG. 2.

The controller may wait for a period of time sufficient to ensure that the transmission circuitry is in a valid operating state before proceeding to act 609. At act 609, the controller disables the receiving circuitry via one or more disable control signals. For example, the controller may disable the receiving amplifier 208 within the receiving circuitry 233 of FIG. 2. Once the receiving circuitry has been disabled, the controller then proceeds to act 611 and controls the switching circuit to couple the output terminal to the transmission path instead of the load path. The method then terminates at act 631.

In other embodiments, the controller is configured to switch to the load state while transitioning from the transmission state to the receiving state. In these embodiments, the controller determines to switch from the transmission state to the receiving state at act 603. The controller then proceeds to act 613 in which the controller controls the switching circuit to couple the output of the transceiver to the load path. The controller then proceeds to act 615 and enables the receiving circuitry via one or more enable control signals. For example, the controller may enable the receiving amplifier 208 within the receiving circuitry 233 of FIG. 2.

The controller may wait for a period of time sufficient to ensure that the receiving circuitry is in a valid operating state. Once the receiving circuitry is in a valid state, the controller proceeds to act 617 and disables the transmission circuitry via one or more disable control signals. For example, the controller may disable a transmission amplifier 207 within the transmission circuitry 231 of FIG. 2. After disabling the transmission circuitry, the controller proceeds to act 619 in which the controller controls the switching circuit to couple the output terminal to the receiving circuitry. The method then terminates at act 631.

In certain configurations, the order in which the controller performs act 607 versus act 609 does not matter so long as enough time is allowed to pass before act 611 is executed. This ensures that the system has reached a steady or valid state before switching to the transmission path at act 611. Similarly, in certain configurations, the order in which the controller performs act 615 versus act 617 does not matter so long as enough time is allowed to pass before act 619 is executed. This ensures that the system has reached a steady or valid state before switching to the receiving path at act 619.

The transceiver may also be configured to switch to the load state when powering down or switching to a sleep mode. In these embodiments, the controller determines to power down or switch to the sleep state at act 603, and proceeds to act 621 in which the controller controls the switching circuit (e.g., switching circuit 210 of FIG. 2) to couple the output terminal (e.g., terminal 102) to the load path. The controller then proceeds to act 623 and disables the transmission circuitry or the receiving circuitry (e.g. whichever one was previously active) via one or more control signals. For example, the controller may disable the transmission amplifier 207 within the transmission circuitry 231, or the receiving amplifier 208 within the receiving circuitry 233, both as illustrated in FIG. 2. The method then terminates at act 631.

Accordingly, by coupling the output terminal to the load path prior to enabling or disabling the transmission circuitry or the receiving circuitry, any spurious outputs or changes in impedance $Z_{out}$ that might be caused by disabling or enabling the receiving circuitry or disabling or enabling the transmission circuitry are not propagated to the shared communications medium 101 (FIG. 1). Further, by ensuring that the transmission circuitry and receiving circuitry are in a valid operating state prior to changing the switching circuit, any spurious outputs or changes in impedance that might be caused by enabling the transmission circuitry and the receiving circuitry are not propagated to the shared communications medium 101.

In additional embodiments, at act 603 the controller may determine that it is being powered up from a powered off state. In these embodiments, following act 603, the controller may similarly perform act 621 and switch to the load and enter the standby mode. Next, the controller will perform either act 607 or act 615 in which the controller enables the transmission or receiving circuitry via one or more enable control signals (depending on whether it is entering the receive mode or the transmit first). Next, the controller with perform either act 611 or 619 and control switching circuitry to couple the output terminal to the receiving path or the transmission path, respectively (in response to whether the receiving circuitry vs. the transmission circuitry was enabled at act 607, 615). The method then terminates at act 631.

Figure 7:
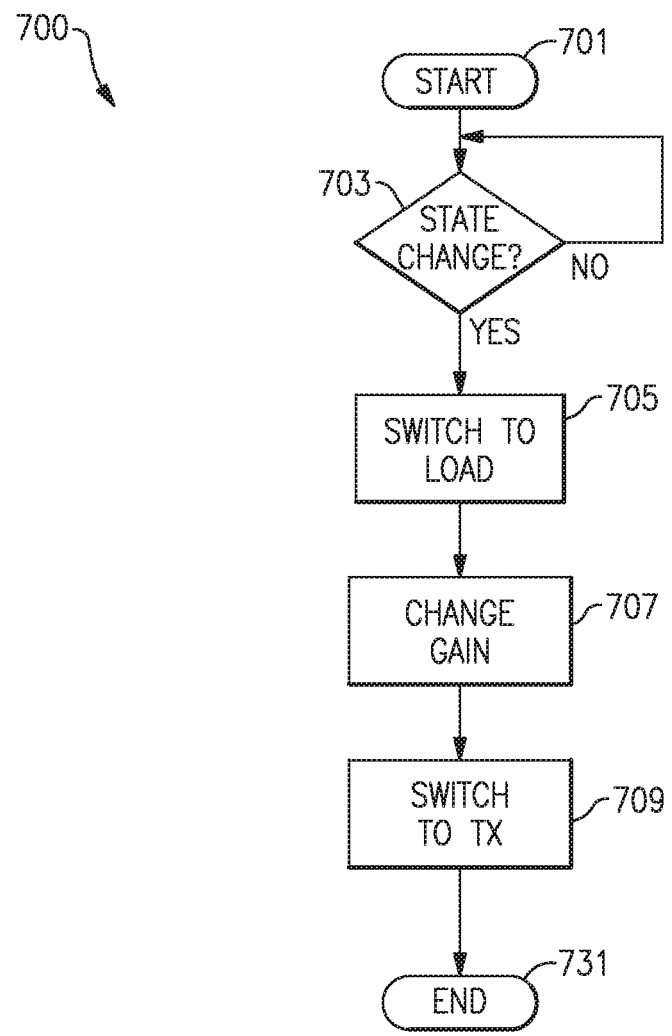
FIG. 7 is a flowchart depicting an additional method of configuring a plurality signal paths in a transceiver to present a substantially constant output impedance during various operating states.

As described above with reference to FIG. 2, FIGS. 3A-3C, and FIG. 3E, several embodiments perform processes that control a switching circuit within a transceiver to switch between a plurality signal paths, each signal path having a certain output impedance. One example of such a process is illustrated in FIG. 7. According to this example, the process 700 includes acts relating to switching between a transmission state and a load state. The process of FIG. 7 is described with continuing reference to the transceiver 205 illustrated in FIG. 2, FIGS. 3A-3C, and FIG. 3E, and components thereof.

FIG. 7 is a flowchart illustrating a method 700 of configuring the connections of a transceiver having a transmission signal path, such as the transceiver 205 of FIG. 2. The method may be implemented by a controller (not shown but described below with reference to at least FIG. 8) that is operatively coupled to the transceiver 205. The method 700 begins at act 701. At act 703, the controller determines whether to change a state of operation of the transceiver. In the example of FIG. 7, the state of the transceiver may correspond to one or more gain states of a transmission amplifier (e.g., transmission amplifier 207) within transmission circuitry of the transceiver. Each gain state may provide a different gain setting to a received signal. Switching to a load state prior to transitioning between the gain states of the transmission amplifier may reduce undesirable transient variations in the output impedance of the transceiver, and provide various other benefits.

At act 705, prior to switching between a first gain state and a second gain state of the transmission amplifier within the transmission circuitry, the controller controls the one or more switching circuits (e.g., switching circuit 210 of FIG. 2) to couple an output terminal of the transceiver to the load path. As discussed herein, relative to the transmission path while the transmission amplifier is switching gain states, the load path may provide a substantially constant impedance level. Once the output terminal is coupled to the load path, at act 707 the controller instructs the transmission amplifier to switch between the first gain state and the second gain state. As discussed herein, a transition in gain state may include an increase in a gain setting or a decrease in the gain setting of the transmission amplifier. That is, the transmission amplifier may increase or decrease an amplification applied to a received signal.

According to various examples, the controller may wait for a period of time sufficient to ensure that the transmission amplifier is in a valid operating state once switched to the second gain state. The controller then proceeds to act 709 and controls the one or more switching circuits to re-couple the output terminal of the transceiver to the transmission path. The method terminates at act 731 once the output terminal and the transmission circuitry are connected.

In cases where the output impedance presented by the transceivers is not well behaved after determining to change states at acts 503, 603, or 703, if it does not already do so, the controller may optionally proceed to couple the output terminal to a known load or impedance during the transition or change of states. The load may be a matching impedance configured to match the impedance of the shared communication medium as described previously. In some embodiments, coupling the output terminal to the load involves recoupling the output terminal to some or all of the same lines, circuitry, or switches as the transmission or receiving paths and changing the mode of operation of one or more components within the transmission or receiving path. For example, some or all of the load may be produced by recoupling the output terminal to a portion of the transmission circuitry and controlling an adjustable attenuator within the portion of the transmission circuitry to operate in a hybrid attenuation-isolation mode configured to present a desired matching impedance and/or perform a desired amount of attenuation. Some or all of the load may be also be generated by coupling the output terminal to a different signal path that does not share any of the same lines, circuitry, or switches as the transmission path, such as interposing a fixed attenuator between the output terminal and the adjustable attenuator even if the fixed attenuator is not typically used while transmitting.

Accordingly, in various examples the transceiver may utilize the load path to isolate the transmission circuitry from the output terminal (and a shared communication medium coupled to the output terminal, e.g. communication medium 101 of FIG. 1) during one or more gain setting adjustments of the transmission amplifier. Similar processes may be performed for the various examples of the receiving circuitry described herein in the instances where the receiving circuitry includes a receiving amplifier that is a variable gain amplifier.

Further, as discussed above with respect to FIGS. 2 and 3A-3E, the "load path" may involve coupling at least some of the same circuitry to the output terminal relative to the "transmission path." One or more switches or switching circuits can be operated to change which circuitry is coupled directly to the output terminal, which will affect the impedance $Z_{out}$ presented by the load path versus the transmission path. For example, as described below with respect to FIGS. 8-9, various circuitry within the front end of an amplifier system 800 of a transceiver 105 may be coupled or decoupled from an output terminal 804 to control the output impedance $Z_{out}$ during a change between two operating modes as follows.

Figure 8:
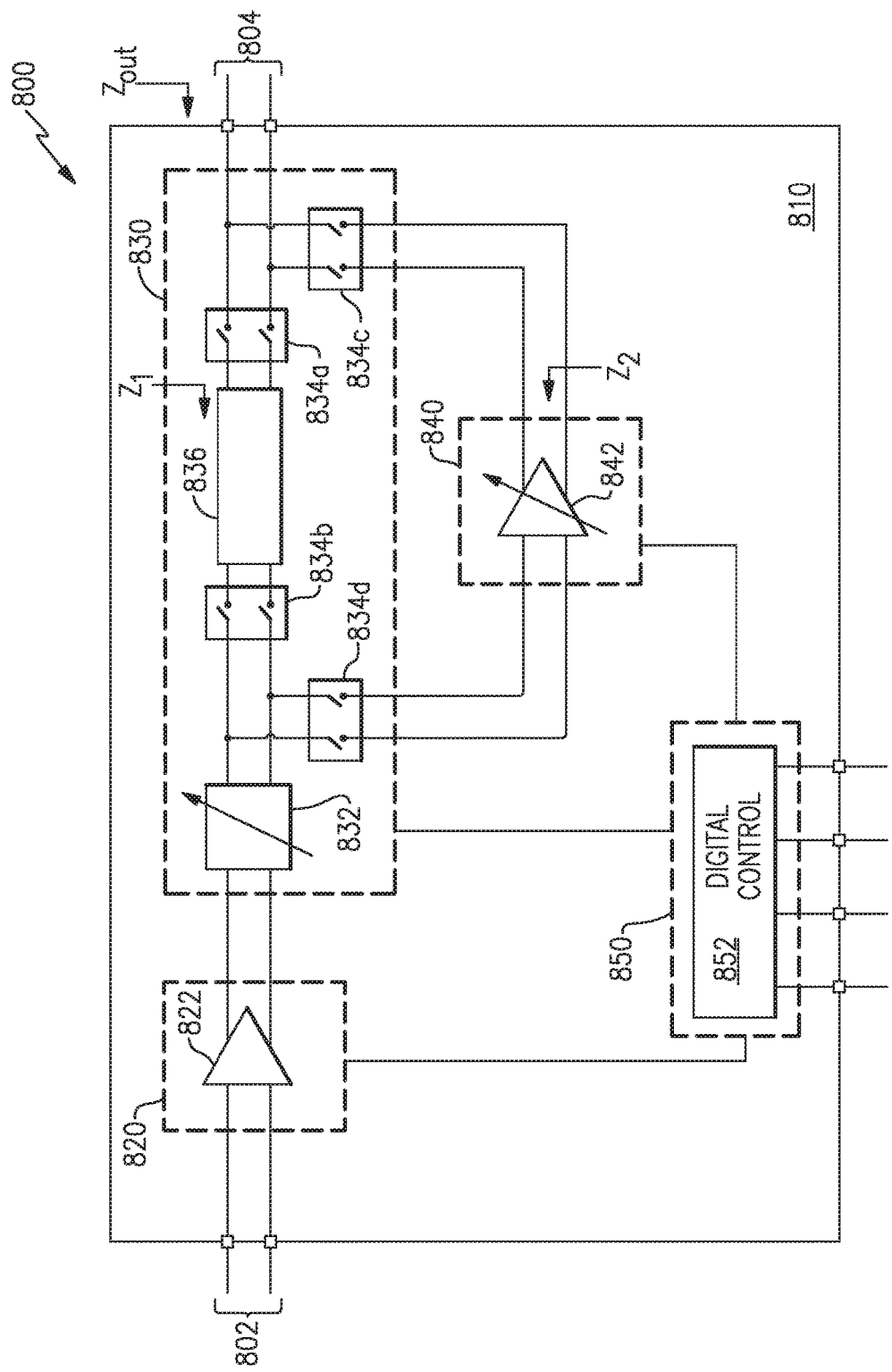
FIG. 8 is a block diagram showing an embodiment of an amplifier system having a plurality of signal paths and corresponding switching circuitry to switch between the plurality of signal paths.

FIG. 8 illustrates a block diagram of an amplifier system 800 forming a portion of the transmission circuitry within a transceiver, such as the transmission path 221 (presenting an impedance $Z_2$) and load path 222 (presenting an impedance $Z_1$) as described in FIGS. 2 and 3A-3C. In some embodiments, the amplifier system may also include circuitry that is analogous to the transmission path 425 as described in FIGS. 4A-4C. Depending on a state change occurring within the transceiver (as described in FIGS. 5-7), the impedance presented by the amplifier system 800 at output node 804 can fluctuate and produce an undesirable impedance mismatch relative to the impedance of a shared communications medium coupled to the output node 804 (such as the shared communications medium 101 described in FIG. 1). As discussed herein, an impedance mismatch between a transmission path and a shared communications medium can cause undesirable signal reflections to propagate from the transmission circuitry back onto the shared communications medium. In order to (1) reduce the impedance mismatch between the transmission path and the shared communications medium, and (2) reduce the magnitude of signal reflections caused by the impedance mismatch, one or more components within the amplifier system 800 can be controlled to set a known output impedance and attenuate any unwanted signal reflections that do occur.

The amplifier system 800 has an input 802 for receiving balanced differential transmit signals and an output 804 for providing balanced differential transmit signals of differing signal levels. In various examples, the output 804 corresponds to the output terminal 102 of the transceiver illustrated in FIGS. 1-2. In other examples, the output 804 may be further coupled to an additional component, such as a balun (not shown), configured to convert the differential transmit signal into a single-ended transmit signal. The balun may provide the single-ended transmit signal to an additional output terminal, such as the output terminal 102 of FIG. 1. The amplifier system 800 within the amplifier system may include multiple chip dies, as described individually in more detail below, provided on a substrate 810. A first die 820 is coupled to the input 802 and includes a fixed gain amplifier 822. A second die 830 is coupled to the output of the fixed gain amplifier 822 and includes an adjustable digital switched attenuator 832 and multiple switches 834a-d that selectively route the transmit signal from the output of the digital switched attenuator 832 to either of a fixed attenuator 836, e.g., a loss pad, in a bypass state, or to a third die 840 that includes a variable gain amplifier 842, in an amplify state. The output of the second die 830 or the third die 840 is coupled to the output 804. Portions of the second die 830 and the third die 840 together may form an output stage that may be in standby state or in amplify state based upon the status of the switches 834.

The switches 834 may be multiple switches as shown or may be fewer switches implemented with, e.g., single-pole double-throw switches that alternately make a connection to one or another signal path. In some embodiments, some of the switches 834 may be configured to enable a signal path by connecting the signal path to the output responsive to receiving a corresponding control signal. Similarly, each of the switches 834 may be configured to disable a signal path by disconnecting the signal path from the output responsive to receiving a similar control signal. In some embodiments, one or more inverters may be coupled to a controller which manages the switches 834 and may selectively invert a given control signal such that a single control signal may cause some of the switches 834 to enable a signal path, and cause the remaining switches 834 to disable a signal path. Each of the switches 834 may be a transistor or any other suitable switch.

As illustrated, the amplifier system 800 also includes a fourth die 850 that includes a controller 852 that provides the control signals to the components included in one or more of the first, second, and the third dies. For example, the controller 852 may communicate with or control attenuation settings of the digital switched attenuator 832, control gain settings of the variable gain amplifier 842, control or adjust a bias current provided to the variable gain amplifier 842 or the fixed gain amplifier 822, and control the switches 834 to place the output stage in standby state or amplify state to establish a net gain of the amplifier system 800. In various examples, the controller 852 may control the various components based upon instructions it receives via a control interface 854.

Similar to the transmission circuitry 207 discussed with reference to FIG. 2, the amplifier output 804 of the amplifier system 800 has an output impedance $Z_{out}$. As discussed, during the operation of the amplifier system 800 within the amplifier system (the amplify mode) the output 804 may present an unstable output impedance $Z_{out}$ that can cause undesirable signal reflections from output 804, among various other undesirable effects. In particular, reflected signals can interfere with an external communications medium coupled to output 804, such as a shared communications medium 101 of FIG. 1.

As illustrated in FIG. 8, the amplifier system 800 may include various differential signal lines which couple each component of the second die 830 to the output 804. In particular, a first differential line couples the fixed attenuator 836 to the output 804 through the set of switches 834a and a second differential line couples the components of the third die 840 (i.e., the die including the variable gain amplifier 842) to the output 804 through the second of switches 834c. Similarly one or more differential signal lines may couple components of the amplifier system 800, such as the fixed gain amplifier 822, to the input 802 of the amplifier system 800. Each component coupled to the output 804 of the amplifier system 800 has a corresponding output impedance, as discussed herein and illustrated in FIG. 8. For instance, the fixed attenuator 836 has an output impedance $Z_1$ and the variable gain amplifier 842 has an output impedance $Z_2$. It is appreciated that while illustrated in FIG. 8 as differential signal lines, in various other examples each line may include a single signal line, or any other suitable signal line or bus.

In various embodiments each of the switches 834a-d may be controlled to isolate one or both of the fixed attenuator 836 and the variable gain amplifier 842. For example, the switch 834b and the switch 834a may be opened to isolate the adjustable attenuator 836, and the switches 834d and 834c may be operated to isolate the variable gain amplifier 842. In various examples, the amplifier system 800 may isolate one or both of the adjustable attenuator 836 and the variable gain amplifier 842 when not in use. Those skilled in the art will appreciate that other switching circuit configurations can be used to effectively provide a similar degree of control for the output 804, and those components of the amplifier system 800 which may be isolated at any given time.

During one or more amplify modes of operation of the amplifier system 800, each of the switches 834c and 834d are controlled to a closed position, and the variable gain amplifier 842 is coupled to the output 804 of the amplifier system 800. Accordingly, during a given amplify mode, the variable gain amplifier is interposed between, and in communication, with the adjustable attenuator 832 and the output 804. Also during a given amplify mode, the switches 834a and 834b are controlled to an open position, and the fixed attenuator 842 is isolated from the output 804 and the adjustable attenuator 832. When operating in the one or more amplify modes, the output impedance $Z_{out}$ of the output 804 is substantially the same as output impedance $Z_2$ of the variable gain amplifier 842.

Similarly, during a standby mode each of the switches 834c and 834d are controlled to an open position, the variable gain amplifier 842 is decoupled from the output 804 and the adjustable attenuator 832. Each of the switches 834a and 834b are controlled to a closed position to couple the fixed attenuator 836 to the adjustable attenuator 832 and the output 804. During the standby mode, the output impedance $Z_{out}$ of the output 804 is substantially the same as output impedance $Z_1$ of the fixed attenuator 836.

When the amplifier system 800 is not in a amplify mode or is switching between a first amplify mode and a second amplify mode (e.g., switching gain settings), the output impedances $Z_1$ and $Z_2$ are prone to undesirable transient fluctuations. Accordingly, in various examples the amplifier system 800 is configured to enter a standby mode during one of these occurrences. In the standby mode, signal reflections caused by fluctuations in the output impedance $Z_{out}$ are attenuated, bypassed, or isolated by the stages of the adjustable attenuator 832 as is described below. In the standby mode of operation, the switches 834a and 834b are controlled to a closed position and the switches 834c and 834d are controlled to an open position. As discussed above, when in the standby mode, the output impedance $Z_1$ is presented by the fixed attenuator 836.

Those skilled in the art will appreciate that an input impedance of the variable gain amplifier 842 may differ significantly from the output impedance $Z_2$ of the variable gain amplifier 842. For example, the input impedance of the variable gain amplifier 842 may substantially match an output impedance of the adjustable attenuator 832. Similarly, the fixed attenuator 836 may also have an input impedance to substantially match the adjustable attenuator 832 and be of a different value than the output impedance $Z_1$ of the fixed attenuator 836. Accordingly, the fixed attenuator 836 may provide impedance matching of the adjustable attenuator 832 to the output 804 when the amplifier system 800 is not in an amplify mode, or is switching between amplify modes. This further allows the adjustable attenuator 832 to have a different impedance from that required at the output 804, while aspects and embodiments disclosed herein remain suitable to maintain the output impedance $Z_{out}$ at the output 804. For example, in certain embodiments, an adjustable attenuator may have 100 Ohm impedance while $Z_{out}$ is to be maintained at 75 Ohm. In such an embodiment, each of the fixed attenuator 836 and the variable gain amplifier 842 may have an input impedance of 100 Ohm and each of the fixed attenuator 836 and the variable gain amplifier 842 may have an output impedance of 75 Ohm. Accordingly, a 75 Ohm output impedance may be presented at the output 804.

In certain examples, the variable gain amplifier 842 may have a 100 Ohm input impedance and a 75 Ohm output impedance, e.g., to match a 100 Ohm output impedance of the adjustable attenuator 832 and a 75 Ohm impedance of a coaxial cable, for instance. Accordingly, when the output stage 830 is in an amplify mode, the variable gain amplifier 842 may provide impedance matching from the adjustable attenuator 832 to an output of the amplifier system 800 overall.

In the standby mode wherein a signal is routed through the fixed attenuator 836 instead of the variable gain amplifier 840, the fixed attenuator 836 may provide impedance matching from its input to its output, e.g., to provide a 100 Ohm input presented to match the output of the adjustable attenuator 832 while providing a 75 Ohm output to match a cable or balun connected to the output of the output stage 830. In certain other examples, during the standby mode, a fixed attenuator 836 may not be interposed between the output terminal 804 and the adjustable attenuator 832 during the standby mode as is shown in FIG. 8. In these embodiments, the output terminal 804 can instead be coupled directly to the adjustable attenuator using appropriate switching circuitry (e.g. in embodiments where the adjustable attenuator is configured to provide sufficient attenuation on its own without the use of a fixed attenuator 836).

Figure 9:
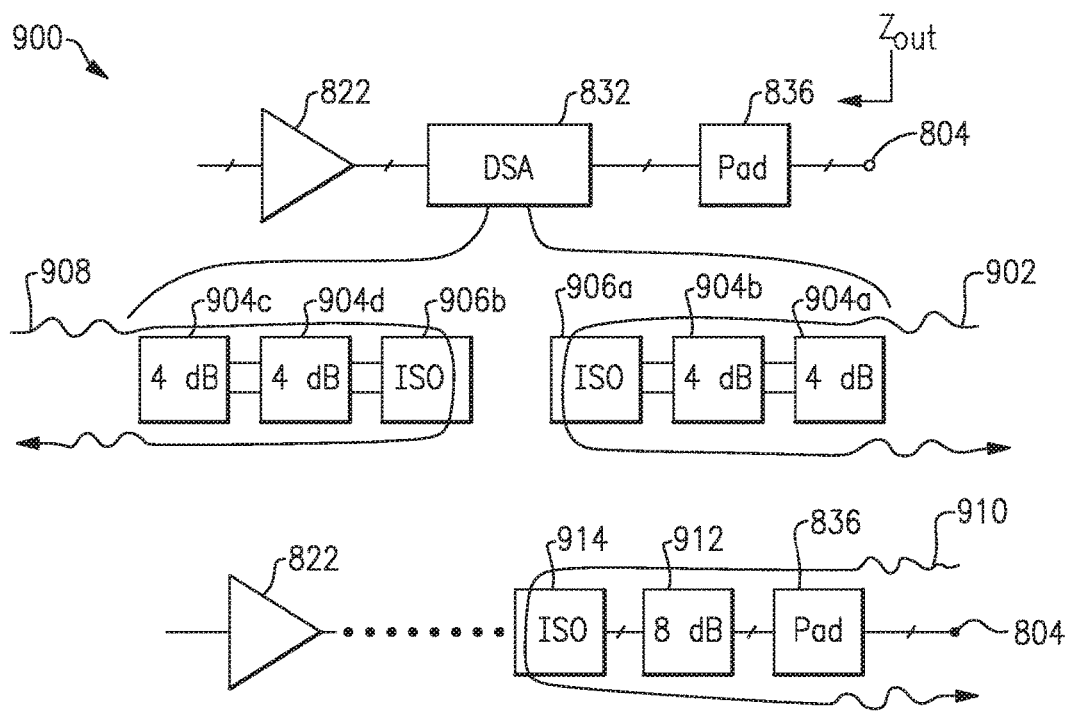
FIG. 9 is a diagrammatic view of a signal path from the amplifier system shown in FIG. 8, the signal path including an adjustable attenuator and a fixed attenuator.

Additionally, during the standby mode, the adjustable attenuator 832 may be controlled to operate in an isolation state. In the isolation state, the adjustable attenuator 832 may attenuate any undesirable signal reflections, to support a stable output impedance $Z_1$ at the fixed attenuator 836. In addition, the isolation state may also be used to attenuate and reflect any spurious emissions that might be provided by the fixed gain amplifier 822. One example of signal reflection attenuation by the adjustable attenuator 832 is illustrated in FIG. 9. Accordingly, the stable output impedance created by the adjustable attenuator 832 during the standby mode of operation stabilizes the output impedance $Z_{out}$ of the output 804 and reduces any impact on the communications medium coupled to output 804.

FIG. 9 illustrates an adjustable attenuator 832 operating in the isolation state that includes a plurality of attenuator cells 904, 906 coupled together in series. Each attenuator cell is capable of being placed in an attenuation mode (904a-d), in which a signal received at the input of the cell is attenuated and passed to the output of the cell, an isolation mode (906a-b), in which a signal received at the input of the cell is passed back to the input of the cell and not permitted through the cell, or a bypass mode, in which a signal received at the input of the cell and is passed to the output of the cell without attenuation.

In particular, FIG. 9 illustrates the attenuator cells 904a-d and 906a-b in series, some of which have been placed in the isolation mode while others have been placed in the attenuation mode. In the example depicted in FIG. 9, the attenuator cells 904a-d are placed into the attenuation mode and the attenuator cells 906a-b are placed into the isolation mode. Each attenuator cell 904a-d in the attenuation mode is configured to provide 4 dB of attenuation to a signal passing through. However, in various other embodiments each attenuator cell 904a-d in the attenuation mode may instead be configured to provide a different amount of attenuation than that shown or may be placed in the bypass mode if no additional attenuation is required.

As shown in the example of FIG. 9, a first attenuator cell 904a is coupled to a second attenuator cell 904b via a first signal line, and the second attenuator cell 904b is coupled to a third attenuator cell 906a via a second signal line. Similarly, a fourth attenuator cell 904*c* coupled to a fifth attenuator cell 904*d*, which is coupled to a sixth attenuator cell 906*b* via respective additional signal lines (each "signal line" may include a pair of differential signal lines as shown in FIG. 9).

In various examples, each attenuator cell 906*a-b* in the isolation mode is configured to act as an open circuit. When not in the isolation mode, each attenuator cell 906*a-b* of the adjustable attenuator 832 may instead be configured to function in the attenuation mode to provide an adjustable amount of attenuation to a received signal or to bypass the signal without providing attenuation. Although FIG. 9 illustrates four attenuator cells 904*a-d* in the attenuation mode (two on each side of the adjustable attenuator 832 i.e., the fixed gain amplifier 822 side and the fixed attenuator 836 side), in various other examples, any suitable number of attenuator cells 904, 906 may be placed in the attenuation mode or isolation mode as needed. Regardless of the total number of cells, when signal isolation is required (e.g. when the transceiver is in a standby mode or is not transmitting or receiving) two attenuator cells 906*a*, 906*b* are placed into the isolation mode incorporated within the adjustable attenuator 832 to reflect any received signal back in the direction in which the signal arrives at the adjustable attenuator 832.

During the isolation state of the adjustable attenuator 832, any signal 902 that enters the output terminal 804 will propagate through the fixed attenuator 836 and be received at the adjustable attenuator 832 at the first attenuator cell 904*a*. Similarly, any signal 908 that is received from the fixed gain amplifier 822 will be received at the adjustable attenuator at the fourth attenuator cell 904*c*.

Regarding the signal 902 received from the output terminal 804, the first attenuator cell 904*a* will attenuate the signal 902 by 4 dB, after which the signal 902 will be attenuated by an additional 4 dB at the next sequential attenuator cell 904*b*. Such an operation will continue until the signal 902 has propagated through the last sequential attenuator cell 904 in the attenuation mode and reached the first sequential attenuator cell 906*a* operating in the isolation mode. The first sequential attenuator cell 906*a* operating in the isolation mode reflects the signal 902 back in the opposite direction of reception back towards the output terminal 804. As the signal 902 propagates in the reverse direction back towards the output terminal 804, it propagates through each attenuator cell 906*a*, 904*b*, 904*a* again in reverse order and is again attenuated by each attenuator cell 904*a*, 904*b* operating in the attenuation mode. In the example shown in FIG. 9, the signal 902 propagates through the second attenuator cell 904*b* and the first attenuator cell 904*a*, resulting in an additional 4 dB of attenuation from each cell 904*a*, 904*b*. Accordingly, any signal entering the adjustable attenuator 832 during the isolation mode is attenuated by a total attenuation value which includes twice the sum of the attenuation provided by each attenuator stage 904*a-b* operating in the attenuation mode.

Similarly, any signal 908 entering the fixed gain amplifier 822 (from within the transmission circuitry of the transceiver) will be similarly isolated and attenuated by the adjustable attenuator 832 as follows. The third attenuator cell 904*c* will attenuate the signal 908 by 4 dB, after which the signal 908 will be attenuated by an additional 4 dB at the next sequential attenuator cell 904*d*. Such an operation will continue until the signal 908 has propagated through the last sequential attenuator cell 904 in the attenuation mode and reached the first sequential attenuator cell 906*b* operating in the isolation mode. The first sequential attenuator cell 906*b* operating in the isolation mode reflects the signal 908 back in the opposite direction towards the fixed gain amplifier 822. As the signal 908 propagates in the reverse direction back towards the fixed gain amplifier 822, it propagates through each attenuator cell 906*b*, 904*d*, 904*c* again in reverse order and is again attenuated by each attenuator cell 904*c*, 904*d* operating in the attenuation mode. In the example shown in FIG. 9, the signal 908 propagates through the third attenuator cell 904*c* and the fourth attenuator cell 904*d*, resulting in an additional 4 dB of attenuation from each cell 904*c*, 904*d*. Accordingly, any signal entering the adjustable attenuator 832 during the isolation mode is attenuated by a total attenuation value which includes twice the sum of the attenuation provided by each attenuator stage 904*c-d* operating in the attenuation mode.

FIG. 9 further includes a representation of a signal 910 (for example the signal 902) interacting with the amplifier system 800 while it is operating in the isolation state. The signal 910 propagates into the amplifier system 800 through the output terminal 804, then travels through the fixed attenuator 836, and through the adjustable attenuator 832. The signal 910 is reflected back by the attenuator cell 906*a* operating in the isolation mode and again propagates through the adjustable attenuator 832 and fixed attenuator 836 in the opposite direction. The signal 910 then exits through the output terminal 804 and returns to the shared communication medium. In total, the signal 910 is attenuated by 16 dB plus twice the attenuation level of the fixed attenuator 836. Specifically, the signal 910 travels through the 8 dB of attenuation 912 in the adjustable attenuator 832 in each direction (2*8 dB=16 dB) and also travels through the fixed attenuator 836 in each direction (2*attenuation level of the fixed attenuator) before reaching the output terminal 804.

Accordingly, in various embodiments the adjustable attenuator 832 may be used to stabilize the output impedance of the fixed attenuation pad 836 during one or more transitions between the amplify modes of the variable gain amplifier 842. In particular, the amplifier system 800 may decouple the variable gain amplifier 842 from the output 804 and couple the output 804 to the adjustable attenuator 832, which is operated in the isolation state to provide a stable output impedance $Z_{out}$ at the output 804 in addition to the signal attenuation described above. Once the variable gain amplifier 842 is in a valid operating state, the amplifier system 800 recouples the variable gain amplifier 842 to the output 804. The adjustable attenuator 832 may be used to stabilize the output 804 in a similar manner when the variable gain amplifier 842 is controlled from an inactive state to one of the amplify modes.

Having described above several aspects of at least one implementation, it is to be appreciated various alterations, modifications, and improvements will readily occur to those skilled in the art. Such alterations, modifications, and improvements are intended to be part of this disclosure and are intended to be within the scope of the description. Accordingly, the foregoing description and drawings are by way of example only, and the scope of the disclosure should be determined from proper construction of the appended claims, and their equivalents.

What is claimed is:

1. A method for reducing impedance changes and signal reflections in a communications system, the method comprising:

connecting an output to a load path presenting a first output impedance configured to match an impedance of a shared communications medium, the output configured to be coupled to the shared communications medium;
enabling a transmission amplifier within a transmission path of the communications system;
determining whether the transmission amplifier is operatively configured to provide a transmission signal;
disconnecting the output from the load path; and
connecting the output to the transmission path responsive to a determination that the transmission amplifier is operatively configured to provide the transmission signal, the transmission path configured to present a second output impedance matching the impedance of the shared communications medium.

2. The method of claim 1 further comprising providing the transmission signal to the output.

3. The method of claim 2 further comprising:
determining that the transmission amplifier is no longer operatively configured to provide the transmission signal; and
disconnecting the output from the transmission path responsive to the determination that the transmission amplifier is no longer operatively configured to provide the transmission signal.

4. The method of claim 3 further comprising disabling the transmission amplifier.

5. The method of claim 3 further comprising reconnecting the output to the load path in response to determining that the communications system is no longer operatively configured to provide the transmission signal.

6. The method of claim 5 further comprising:
enabling a receiving amplifier within a receiving path of the communications system; and
determining whether the receiving amplifier is operatively configured to receive signals from the output.

7. The method of claim 6 further comprising connecting the output to the receiving path in response to determining that the receiving amplifier is operatively configured to receive signals from the output.

8. The method of claim 1 further comprising:
receiving a signal at the load path from the output;
attenuating the signal to produce an attenuated signal; and
providing the attenuated signal to the output.

9. The method of claim 8 wherein receiving the signal at the load path from the output further includes receiving the signal at an adjustable attenuator, and wherein attenuating the signal further includes using the adjustable attenuator with at least one cell operating in an isolation mode.

10. The method of claim 1 further comprising:
receiving a signal at the load path from the transmission amplifier;
attenuating the signal to produce an attenuated signal; and
providing the attenuated signal to the transmission amplifier.

11. The method of claim 10 wherein receiving the signal at the load path from the transmission amplifier further includes receiving the signal at an adjustable attenuator, and wherein attenuating the signal further includes using the adjustable attenuator with at least one cell operating in an isolation mode.

12. A transmitter system having an output configured to match an impedance of a shared communications medium, comprising:
a transmission amplifier configured to be coupled to the output and provide a transmission signal to the output in a first mode of operation, the transmission amplifier being configured to present a first output impedance substantially matching the impedance of the shared communications medium;
a load path configured to be coupled to the output in a second mode of operation and present a second output impedance substantially matching the impedance of the shared communications medium;
switching circuitry configured to selectively couple one of the transmission amplifier and the load path to the output; and
a controller configured to receive an indication that the transmitter system is to transition between the first and second modes of operation, and in response to receiving the indication, to control the switching circuitry to either decouple the transmission amplifier from the output and couple the load path to the output, or to decouple the load path from the output and couple the transmission amplifier to the output.

13. The transmitter system of claim 12 wherein the load path is further configured to attenuate signals received from the output in the second mode of operation and to provide attenuated signals to the shared communications medium via the output, the attenuated signals having a lower magnitude than the signals received from the output.

14. The transmitter system of claim 13 wherein the load path includes an adjustable attenuator.

15. The transmitter system of claim 14 wherein the adjustable attenuator is a digital switched attenuator including at least one attenuator cell operating in an isolation mode.

16. The transmitter system of claim 12 wherein the load path is further configured to attenuate signals received from the transmission amplifier in the second mode of operation and to provide attenuated signals to the transmission amplifier, the attenuated signals having a lower magnitude than the signals received from the transmission amplifier.

17. The transmitter system of claim 16 wherein the load path includes an adjustable attenuator.

18. The transmitter system of claim 17 wherein the adjustable attenuator is a digital switched attenuator including at least one attenuator cell operating in an isolation mode.

19. A transceiver system having an output configured to match an impedance of a shared communications medium, comprising:
a transmission amplifier configured to be coupled to the output and provide a transmission signal to the output in a first mode of operation, the transmission amplifier being configured to present a first output impedance substantially matching the impedance of the shared communications medium;
a load path configured to be coupled to the output in a second mode of operation and present a second output impedance substantially matching the impedance of the shared communications medium;
receiving circuitry configured to be coupled to the output and receive a reception signal from the output in a third mode of operation, the receiving path being configured to present a third output impedance substantially matching the impedance of the shared communications medium;
switching circuitry configured to selectively couple one of the transmission amplifier, the receiving circuitry, and the load path to the output; and
a controller configured to receive an indication that the transmitter system is to transition among the first, second, and third modes of operation, and in response to receiving the indication, to control the switching circuitry to decouple the transmission amplifier from the output and couple the load path to the output, to decouple the load path from the output and couple the transmission amplifier to the output, to decouple the receiving circuitry from the output and couple the load path to the output, or to decouple the load path from the output and couple the receiving circuitry to the output.

20. The transceiver system of claim 19 wherein the load path is further configured to attenuate signals received from the output in the second mode of operation and to provide attenuated signals to the shared communications medium via the output, the attenuated signals having a lower magnitude than the signals received from the output.

21. The transceiver system of claim 20 wherein the load path includes an adjustable attenuator including at least one attenuator cell operating in an isolation mode.

22. The transceiver system of claim 19 wherein the load path is further configured to attenuate signals received from the transmission amplifier in the second mode of operation and to provide attenuated signals to the transmission amplifier, the attenuated signals having a lower magnitude than the signals received from the transmission amplifier.

23. The transceiver system of claim 22 wherein the load path includes an adjustable attenuator including at least one attenuator cell operating in an isolation mode.

* * * * *